(12) United States Patent
Terada et al.

(10) Patent No.: US 6,280,559 B1
(45) Date of Patent: Aug. 28, 2001

(54) METHOD OF MANUFACTURING COLOR ELECTROLUMINESCENT DISPLAY APPARATUS AND METHOD OF BONDING LIGHT-TRANSMITTING SUBSTRATES

(75) Inventors: Kousuke Terada, Tenri; Koichi Tanaka, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/338,600

(22) Filed: Jun. 23, 1999

(30) Foreign Application Priority Data

Jun. 24, 1998 (JP) .................................................. 10-177573
Oct. 26, 1998 (JP) .................................................. 10-304455

(51) Int. Cl.$^7$ ......................................................... H01J 1/68
(52) U.S. Cl. ............................. 156/295; 156/67; 156/150; 156/151; 313/498; 313/505; 313/506; 313/507; 313/112; 315/169.3
(58) Field of Search ............................... 156/67, 150, 151, 156/295; 313/498, 505, 506, 507, 510, 512, 112; 315/169.3; 427/66; 445/24, 25

(56) References Cited

U.S. PATENT DOCUMENTS 5,949,188 * 9/1999 Leising et al. ...................... 313/505

FOREIGN PATENT DOCUMENTS

| 60-2980 | 1/1985 | (JP) . |
| 63-18326 | 1/1988 | (JP) . |
| 64-40887 | 2/1989 | (JP) . |
| 64-40888 | 2/1989 | (JP) . |
| 3-126646 | 5/1991 | (JP) . |
| 3-77640 B2 | 12/1991 | (JP) . |
| 6-194615 | 7/1994 | (JP) . |
| 6-349962 | 12/1994 | (JP) . |
| 9-278497 | 10/1997 | (JP) . |

* cited by examiner

Primary Examiner—Michael W. Ball
Assistant Examiner—Jessica Rossi
(74) Attorney, Agent, or Firm—Nixon & Vanderhye P.C.

(57) ABSTRACT

An object of the invention is to prolong the seal life of a color EL display apparatus. The initial thickness of a light-transmitting main substrate is larger than a predetermined reference thickness WC. First, a plurality of thin-film EL devices are formed on one surface of the main substrate. Then, a sealing substrate having a concave portion formed in one surface thereof is bonded onto the one surface of the main substrate at predetermined intervals. Then, a protective material for protecting the thin-film EL devices is filled in the gap between the one surface of the main substrate and the sealing substrate. Then, the main substrate is processed so as to have the reference thickness WC. Then, a color filter portion is formed on the other surface of the main substrate. Lastly, a reinforcing substrate is attached to the other surface of the main substrate with the color filter portion in between. Consequently, a color EL display apparatus having a sealing portion of the same structure as that of the currently-used sealing portion is completed.

6 Claims, 17 Drawing Sheets

FIG. 3

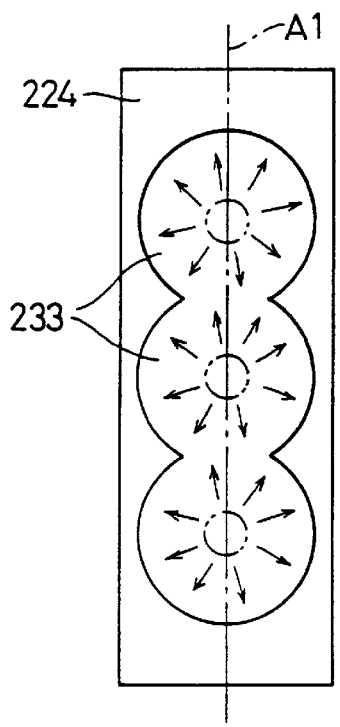
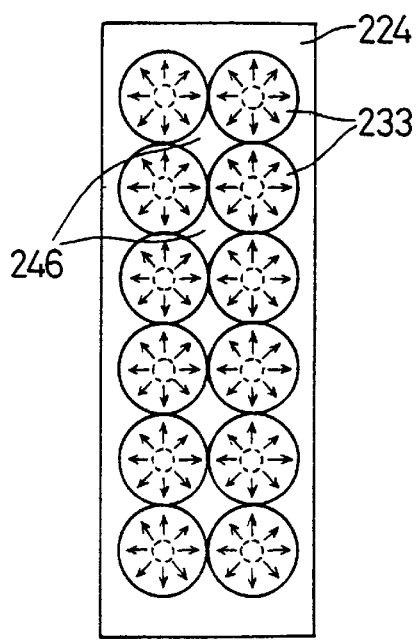
FIG. 11A  FIG. 11B
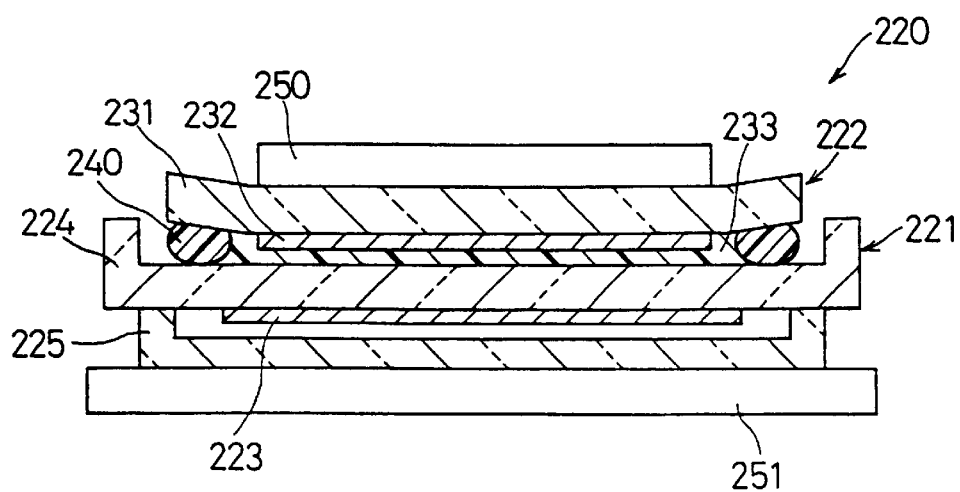
FIG. 12

METHOD OF MANUFACTURING COLOR ELECTROLUMINESCENT DISPLAY APPARATUS AND METHOD OF BONDING LIGHT-TRANSMITTING SUBSTRATES

BACKGROUND OF THE INVENTION

1. Field of the Invention

The present invention relates to a method of manufacturing a color electroluminescent display apparatus applied to various types of thin-plate display apparatuses, and a method of bonding light-transmitting substrates used for the same.

2. Description of the Related Art

An electroluminescent (hereinafter, abbreviated as "EL") display apparatus is a thin display apparatus capable of matrix display like a liquid crystal display apparatus. The EL display apparatus comprises a plurality of EL devices arranged on a substrate. Each of the EL devices comprises an EL light emission layer interposed between a pair of electrodes, and acts as a picture element of the EL display apparatus. When a so-called high alternating field is generated between the pair of electrodes, the EL light emission layer causes electroluminescence, so that light is emitted from the EL light emission layer. This light is so-called EL light. That is, unlike the liquid crystal display apparatus, the EL display apparatus is of a self-light-emission-type display apparatus that is constituted only by solid-state devices. Moreover, compared to the liquid crystal display apparatus, the EL display apparatus is high in contrast and excellent in legibility. Since the EL display apparatus has the above-mentioned characteristics that cannot be obtained from the liquid crystal display apparatus, research thereon is being widely performed. In recent years, research has been performed on the achievement of a thin-film EL display apparatus capable of color display. The thin-film EL display apparatus, which is a type of the EL display apparatus, uses so-called thin-film EL devices as the EL devices.

The applicant has proposed a first prior art regarding the achievement of an EL display apparatus capable of color display in Japanese Examined Patent Publication JP-B2 3-77640 (1991). A color EL display apparatus using thin-film EL devices according to the first prior art has a structure such that three kinds of EL light emission layers that emit light beams of wavelengths of red, green and blue by electroluminescence, respectively, are arranged in parallel and the EL light emission layers are each sandwiched between a pair of electrodes. In order to put the color EL display apparatus to practical use, it is necessary for the EL light emission layers to emit light beams of the wavelengths with a brightness necessary for matrix display. Generally, the wavelength and the brightness of the light emitted from an EL light emission layer by electroluminescence depends on the material of the EL light emission layer. Since there are few materials that emit light beams of the wavelengths of red, green and blue with the above-mentioned brightness, it is difficult to realize the color EL display apparatus.

A second prior art regarding the achievement of a color EL display apparatus is disclosed in Japanese Unexamined Patent Publication JP-A 64-40887 (1989). The color EL display apparatus of this prior art includes a plurality of thin-film EL devices of a double insulation structure including a light emission layer that emits so-called white light by electroluminescence, and a plurality of organic color filters each transmitting light of the wavelength of only one of red, green and blue. The color filters are each placed directly on one electrode of the pair of electrodes of each thin-film EL device. The white light emitted from each EL device is divided into spectra by the color filters. Consequently, light beams of the wavelengths of red, blue and green exit from the color EL display apparatus.

The thin-film EL devices of the double insulation structure in which thin-film insulation layers are interposed between the electrodes and the light emission layers has a structure such that a multiplicity of thin film pieces are laminated. In forming the film pieces, a defect such as a pinhole is sometimes caused in the film pieces. In the case where the insulation layer has a defect such as a pinhole, when the high alternating field is created between the pair of electrodes of the thin-film EL devices, an electrical breakdown is caused at the pinhole and in the vicinity thereof, so that a microdischarge is caused. There are cases where the color filters on the electrodes deteriorates and breaks due to the microdischarge.

As a third prior art regarding the achievement of a color EL display apparatus, Japanese Unexamined Patent Publication JP-A 64-40888 (1989) discloses an art to prevent the above-mentioned deterioration and breakage of the color filters. FIG. 20 is an enlarged partial cross-sectional view of a color EL display apparatus 1 according to this prior art. The color EL display apparatus 1 comprises a main substrate 3, a light-transmitting substrate 4, a plurality of thin-film EL devices 5 of the double insulation structure, a plurality of color filters 6 and a sealing portion 7. The thin-film EL devices 5 are arranged on one surface 9 of the main substrate 3. The color filters 6 are arranged on one surface 10 of the light-transmitting substrate 4. The main substrate 3 and the light-transmitting substrate 4 are disposed so that the surfaces 9 and 10 are opposed with a predetermined gap in between. The sealing portion 7, which is so-called passivation protecting means, is disposed between the main substrate 3 and the light-transmitting substrate 4.

The method of manufacturing the color EL display apparatus 1 will briefly be described below. First, a plurality of lower electrodes 11 which are thin film strips are formed on the one surface 9 of the substrate 3. Then, a lower insulation layer 12, a light emission layer 13 and an upper insulation layer 14 are successively laminated in this order on all the lower electrodes 11. Then, a plurality of upper electrodes 15 which are thin film strips are formed on the upper insulation layer 14. The upper electrodes 15 each transmit light. The direction of length of the lower electrodes 11 and the direction of length of the upper electrodes 15 are perpendicular to each other when viewed from the direction of the normal 16 to the one surface 9 of the substrate 3. The portions where the lower electrodes 11 and the upper electrodes 15 intersect when viewed from the direction of the normal 16 are the thin-film EL devices 5. In order to improve the crystallinity of the light emission layer 13, after the light emission layer 13 is formed or after the upper insulation layer 14 is formed, annealing is performed in a vacuum or in an inert gas.

Then, the color filters 6 are formed on the one surface 10 of the light-transmitting substrate 4. Then, the substrate 3 and the light-transmitting substrate 4 are bonded by an epoxy resin 17 so that the surfaces 9 and 10 are opposed with the predetermined gap in between. Lastly, in order to form a protective material layer 18, the gap between the substrate 3 and the light-transmitting substrate 4 is filled with a gaseous or a liquid protective material. The epoxy resin 17 and the protective material layer 18 constitute the sealing portion 7. By the above-described process, the color EL display apparatus is completed.

Generally, the inactivation protecting means, that is, the sealing portion 7 is provided for shielding the thin-film EL devices from the atmosphere to thereby stabilize the thin-film EL devices and protecting the thin-film EL devices from mechanical failures. A so-called seal life which is one of the greatest characteristics of typical EL display apparatuses depends on the structure of the sealing portion.

A sealing portion currently used in a typical thin-film EL display apparatus is formed by use of a sealing substrate and a mixture liquid of silica gel and silicone oil. The process of forming the currently-used sealing portion will be described below. The typical thin-film EL display apparatus comprises a plurality of EL devices arranged on one surface of a substrate. First, a concave portion with a depth of 300 to 500 µm is formed in one surface of the sealing substrate. Then, the sealing substrate and the substrate are bonded together so that the concave portion is opposed to the one surface of the substrate and that a filling hole is left. Then, the gap between the substrate and the sealing substrate is evacuated, and the mixture liquid is filled into the gap. Lastly, the filling hole is sealed, which completes the currently-used sealing portion.

The silica gel absorbs moisture intruding into the gap. The silicone oil circulates the silica gel in the gap and cools the EL devices. Consequently, the EL devices are protected from the influence of moisture and the like. The seal life obtained from the currently-used sealing portion is not less than 50 thousand hours.

In the color EL display apparatus 1 of the third prior art, the light-transmitting substrate 4 is used instead of the sealing substrate, and the protective material is filled into the gap between the substrate 3 and the light-transmitting substrate 4 to form the sealing portion 7. However, in the color EL display apparatus 1, in order to ensure a viewing angle sufficient for practical use, it is necessary that the gap between the substrate 3 and the light-transmitting substrate 4 be minimized. Consequently, the gap between the substrate 3 and the light-transmitting substrate 4 is frequently a fraction of the width of the gap in the currently-used sealing portion. Therefore, the seal life of the color EL display apparatus 1 is reduced to a fraction of that of the EL display apparatus having the currently-used sealing portion. Further, in the color EL display apparatus 1, since the silica gel enters the gap between the EL devices and the color filters, blur and distortion are caused in the display.

As a fourth prior art regarding the achievement of a color EL display apparatus, Japanese Unexamined Patent Publication JP-A 64-40888 (1989) further discloses an art to form color filters while employing the currently-used sealing portion. A color EL display apparatus according to the fourth prior art has a structure such that a plurality of EL devices are arranged on one surface of a substrate, a plurality of color filters are arranged on the other surface of the substrate and the above-described currently-used sealing portion is disposed on the one surface of the substrate. However, in the color EL display apparatus of the fourth prior art, since the thickness of the substrate is 1 to 2 mm, color displacements of the display are apt to be large and it is difficult to increase the degree of precision of the thin-film EL devices. Moreover, since the substrate thickness of the EL display apparatus is generally not less than 1.1 mm, the viewing angle of the color EL display apparatus of the fourth prior art is apt to be extremely narrow compared to those of the EL display apparatuses of the first to the third prior arts.

In order to improve the viewing angle of the color EL display apparatus of the fourth prior art, it is necessary that the thickness of the substrate be smaller than the thickness of general substrates. When the thickness of the substrate is reduced, in the steps of forming various thin films and the step of photoprocess in the process of manufacturing the color EL display apparatus of the fourth prior art, it is difficult to ensure a substrate strength necessary for the steps and to handle the substrate. At the same time, there is a possibility that the substrate cracks when the gap is evacuated in order to fill the mixture liquid into the gap. Because of these problems, it is difficult to reduce the thickness of the color EL display apparatus of the fourth prior art so as to be smaller than the thickness of general substrates.

Moreover, there are cases where a photo-setting resin is used, for example, for bonding a light-transmitting substrate having the color filters disposed thereon and the other substrate. However, since the color filters intercept light necessary for hardening the photo-setting resin such as ultraviolet rays, the photo-setting resin cannot harden in the area where the color filters are disposed.

Moreover, in the case where two light transmitting substrates are bonded together by filling the gap between the substrates with an adhesive, when there are portions where the adhesive is absent, that is, when bubbles are formed, the refractive index of the portions is different from that of the surrounding portions, so that the configurations of the bubbles appear on the display screen when a display is provided. This degrades the display quality.

In the case where two light-transmitting glass substrates are bonded together, a conventionally used method is such that an adhesive is thinly applied onto the surface of one glass substrate and then, the two substrates are brought into intimate contact with each other. However, in the case where an adhesive is applied, it cannot be helped that slight wavy patterns are formed on the surface. When the uneven portions of the wavy patterns are in contact with the substrate, air gaps are formed between the substrate and the adhesive. When there is no place for the air in the air gaps to escape into, the air gaps are left as bubbles.

As a method of bonding two substrates without such bubbles being formed, for example, Japanese Unexamined Patent Publication JP-A 63-18326 (1988) discloses a method in which bubbles are blown off by a spinner rotation after the substrates are bonded. Japanese Unexamined Patent Publication JP-A 9-278497 (1997) discloses a method in which when substrates are bonded together, the substrates are inclined by an apparatus for controlling the angles of the substrates in order that no bubbles are formed. Japanese Unexamined Patent Publication JP-A3-126646 (1991) discloses a method in which when an adhesive is applied to the substrate, the thickness of the adhesive is controlled so as to monotonously increase from one end to the other end to thereby prevent the formation of bubbles when the substrates are bonded together. Japanese Unexamined Patent Publication JP-A 6-349962 (1994) discloses a bonding method in which a central portion of glass formed so that the central portion thereof is higher than the other portions thereof is melted to bond the two substrates to thereby prevent the formation of bubbles. However, the bonding methods disclosed in the prior arts all require separate apparatuses having complicated structures, which increases the manufacturing cost. Therefore, an easier method is desired in order to increase industrial use.

Moreover, when two substrates are bonded together by dropping a liquid hardening resin on one surface of a thin substrate, there are cases where the dropped resin concaves the thin substrate and the concaved portion is left as a distortion of the EL display screen to degrade the display quality.

Moreover, glass substrates generally have local and small asperities. FIG. 21 is a plan view schematically showing conditions in bonding substrates having such local concave portions. When the substrates are brought into intimate contact with each other so that a liquid hardening resin spreads between the substrates, as shown in FIG. 21, although the speed at which the resin spreads is constant in the area where a local concave portion P is absent, the resin spreading speed is lower in the local concave portion P than in the periphery. Consequently, as shown in FIG. 21, the resin spreads over the periphery of the concave portion P faster in the vicinity of the concave portion P, so that the periphery is filled with the resin without the resin being spread over the concave portion P. As a result, a bubble is left in the concave portion P.

SUMMARY OF THE INVENTION

An object of the invention is to provide a method of manufacturing a color EL display apparatus having a long seal life, a wide viewing angle and improved display quality, and a light-transmitting substrate bonding method used for the manufacturing method.

The invention provides a method of manufacturing a color EL display apparatus comprising the steps of:

forming a plurality of EL devices in which an EL light emission layer is interposed between a pair of electrodes, on one surface of a first light-transmitting substrate having a thickness larger than a predetermined reference thickness;

attaching a second substrate to the one surface of the first substrate with a predetermined gap in between;

filling a material for protecting the EL devices, into a gap between the one surface of the first substrate and the second substrate;

processing the first substrate so as to have the reference thickness; and attaching color filters each capable of transmitting light of a predetermined wavelength to the other surface of the first substrate.

According to the invention, the light emitted from the EL display devices exits from the color EL display apparatus manufactured by the above-described method after being transmitted by the color filters. By the color filters being capable of transmitting light of different wavelengths, so-called multicolor light emission is enabled.

In the above-described manufacturing method, after the first substrate and the second substrate are bonded together and the material is filled into the gap between the substrates, the first substrate is processed so as to have the reference thickness. The reference thickness is, for example, smaller than that of the above-described prior art color EL apparatuses. Therefore, in the process of manufacturing the color EL display apparatus, the thickness of the first substrate is larger than the reference thickness during a period from the EL device forming process to the material filling process. Consequently, during the period, the strength of the first substrate is greater than that of a substrate of the reference thickness. Therefore, the first substrate is prevented from warping in the EL device forming process, and the handling of the first substrate in the forming process is facilitated. Further, the first substrate is prevented from cracking in the material filling process. Thus, the manufacture of the color EL display apparatus is easy compared to the case where the thickness of the first substrate is the reference thickness from the start of the manufacturing process.

Further, in the color EL display apparatus of the invention, the structure of the sealing portion comprising the second substrate and the material is substantially the same as the structure of the currently-used sealing portion of typical color EL display apparatuses. Therefore, the seal life of the color EL display apparatus of the invention is long compared to that of the color EL display apparatus of the above-described third prior art.

Consequently, a color EL display apparatus having a seal life sufficient for practical use can easily be manufactured.

Moreover, in the invention it is preferable that the reference thickness is not more than 1.2 times the width of an interval between one electrodes of the pairs of electrodes in two adjacent EL devices.

According to the invention, the reference thickness, that is, the after-processing thickness of the color EL display apparatus manufactured by the manufacturing method of the invention is not more than 1.2 times the width of the interval. Consequently, the viewing angle of the color EL display apparatus is not less than 160°. As a result, the viewing angle of the color EL display apparatus is sufficient for practical use.

Moreover, in the invention it is preferable that the reference thickness is not less than 25 $\mu$m and not more than 200 $\mu$m.

According to the invention, the reference thickness, that is, the after-processing thickness of the first substrate of the color EL display apparatus manufactured by the manufacturing method of the invention is not less than 25 $\mu$m and not more than 200 $\mu$m. This is for the following reason: At present, the electrode pitch of a prior art direct matrix color EL display apparatus featuring high-resolution display is not less than 2 per millimeter. Therefore, the distance between the electrodes of two adjacent EL devices in the prior art color EL display apparatus is approximately 50 to 150 $\mu$m. Therefore, by the reference thickness being not more than 200 $\mu$m, when the distance between the electrodes of adjacent EL devices in the color EL display apparatus manufactured by the manufacturing method of the invention is the same as that in the prior art color EL display apparatus, the viewing angle dependency of the color EL display apparatus is significantly improved compared to that of the prior art color EL display apparatus. The thinner the first substrate is, the higher the possibility is that the first substrate is damaged in the manufacturing process after the processing of the first substrate. Considering the processing accuracy of the first substrate, it is necessary to consider that there is an error of ±10 $\mu$m in the after-processing thickness of the first substrate. From these, since there is no margin when the reference thickness is less than 25 $\mu$m, the reference thickness is set to not less than 25 $\mu$m.

Moreover, in the invention it is preferable that the reference thickness is not less than 50 $\mu$m and not more than 100 $\mu$m.

According to the invention, the reference thickness, that is, the after-processing thickness of the first substrate of the color EL display apparatus manufactured by the manufacturing method of the invention is not less than 50 $\mu$m and not more than 100 $\mu$m. This is for the following reason: In the case where the reference thickness is not more than 50 $\mu$m, when the actual production of the color EL display apparatus is considered, it is difficult to ensure processing accuracy in the processing of the first substrate. Moreover, in this case, when the actual production of the color EL display apparatus is considered, handling of the first substrate is difficult after the processing of the first substrate. Therefore, the reference thickness is set to not less than 50 $\mu$m in order to ensure the processing accuracy of the first substrate and to facilitate the handling of the first substrate. Moreover, considering the electrode pitch of currently-used EL panels, the reference thickness is set to not more than 100 μm in order to obtain a viewing angle of 80° at the electrode pitch. The viewing angle of 80° is required when the color EL display apparatus is used as the display of a personal computer for private use.

Moreover, in the invention it is preferable that the second substrate has a thickness of 0.8 mm or more.

According to the invention, it is preferable that the thickness of the second substrate is not less than 0.8 mm. This is for the following reason: The second substrate not only forms a gap into which the material is filled but also suppresses the warp of the first substrate due to the internal stress in the EL devices during and after the processing of the first substrate. Moreover, a concave portion is frequently formed in the second substrate in order to maximize the gap into which the material is filled. Further, the second substrate is frequently made of a glass material. When the thickness of the second substrate is not less than 0.8 mm, the warp of the first substrate can surely be suppressed even when the second substrate is made of a glass material and has a concave portion formed therein.

Moreover, in the invention it is preferable that the method further comprises a step of attaching a third light-transmitting substrate to the other surface of the first substrate with the color filters in between.

According to the invention, in the color EL display apparatus manufacturing method, lastly, the third substrate is further attached to the other surface of the first substrate. Consequently, the color filters are protected by being sandwiched between the first substrate and the third substrate. Moreover, by further attaching the third substrate, the overall mechanical strength of the color EL display apparatus can be made greater than that in the case where the third substrate is not attached.

Moreover, in the invention it is preferable that the third substrate has a thickness of 0.5 mm or more.

According to the invention, the thickness of the third substrate is not less than 0.5 mm. This is for the following reason: Typically, a color EL display apparatus is frequently housed in a box together with a driving IC for driving the color EL display apparatus to form a so-called display unit. The display unit manufacturing process includes the step of connecting the tab of the driving IC to the electrodes of the EL devices and the step of placing the color EL display apparatus in the box. When the thickness of the third substrate is not less than 0.5 mm, the entire color EL display apparatus manufactured by the above-described manufacturing method can have a mechanical strength necessary for the display unit manufacturing process.

Consequently, the color EL display apparatus has a seal life sufficient for practical use and can easily be manufactured.

The invention provides a method of manufacturing a color EL display apparatus, comprising the steps of:

preparing EL devices in which a first light-transmitting electrode, an EL light emission layer and a second electrode are formed on one surface of a light-transmitting EL-device substrate and EL light is emitted from the other surface of the EL-device substrate, and a color filter substrate where color filters are disposed on one surface of a light-transmitting substrate; and filling a thermosetting resin into a gap between the other surface of the EL-device substrate and the surface of the color filter substrate where the color filters are disposed, and then thermally setting the thermosetting resin to bond the color filter substrate and the EL-device substrate.

According to the invention, a thermosetting resin is filled into the gap between the other surface of the EL-device substrate and the surface of the color filter substrate where the color filters are disposed, and then, the substrates are heated to harden the thermosetting resin, thereby bonding the color filter substrate and the EL-device substrate. Conventionally, since a photo-setting resin is used for the bonding of the color filter substrate and the EL-device substrate, the photo-setting resin cannot be hardened in an area where the color filters are disposed. However, in the invention using a thermosetting resin, the color filter substrate and the EL-device substrate can be bonded by hardening the thermosetting resin by heating even in the area where the color filters are disposed. Consequently, the color filter substrate and the EL-device substrate can be bonded through an adhesive layer over the entire surface where the color filters are disposed, so that a sufficient bonding strength is obtained.

The invention provides a method of bonding two substrates at least one of which is a light-transmitting substrate, the method comprising the steps of dropping a liquid hardening resin on one substrate so as to convexly bulge; and subsequently bring the two substrates into intimate contact so that the liquid hardening resin is spread to fill a gap between the substrates and be hardened.

According to the invention, the liquid hardening resin is dropped on one substrate so as to convexly bulge, that is, in a conical shape having one convex portion, and then, the two substrates are brought into intimate contact with the other substrate being pressed against the liquid hardening resin on the one substrate. At this time, since the liquid hardening resin convexly bulges, the liquid hardening resin and the other substrate are in contact at one point at the top of the portion of the dropped liquid hardening resin, and by bringing the substrates into intimate contact, the liquid hardening resin is radially spread from the top to fill the gap between the substrates. By the convex liquid hardening resin portion being thus spread, no air gap is formed in the resin, so that the resin can be filled in the gap between the substrates with the formation of bubbles being prevented. The two substrates can be bonded by hardening the liquid hardening resin after the resin is filled. By such an easy method, the substrates can be bonded without any bubbles being mixed, so that the manufacturing cost can be reduced.

The invention provides a method of bonding two substrates at least one of which is a light-transmitting substrate, comprising the steps of:

dropping a liquid hardening resin onto each of the two substrates so as to convexly bulge; and subsequently bring the two substrates into intimate contact so that tops of resin portions on the substrates are in contact with each other and the liquid hardening resin is spread to fill a gap between the substrates and is hardened.

According to the invention, when the two substrates are brought into intimate contact with each other so that the tops of the portions of the liquid hardening resin dropped on the two substrates so as to convexly bulge are in contact with each other, the substrates are connected at one resin portion, so that when the substrates are brought into intimate contact, the liquid hardening resin is radially spread from one resin portion and the resin is filled in the gap between the substrates without any bubbles being formed. By thus dropping the liquid hardening resin onto both substrates, compared to the case where the liquid hardening resin is dropped onto only one substrate, the portion of the substrate with which the dropped resin is in contact is small even when the amount of application is the same, so that the resin can be filled in the gap between the substrates with the mixture of bubbles being further prevented. Moreover, the manufacturing cost can be reduced by such an easy bonding method.

The invention provides a method of bonding two substrates at least one of which is a light-transmitting substrate, comprising the steps of:

dropping a liquid hardening resin onto one substrate at a plurality of points along a straight line or a zigzag line; and subsequently bringing the two substrates into intimate contact so that the liquid hardening resin is spread to fill a gap between the substrates and is hardened.

According to the invention, the two substrates are brought into intimate contact after the liquid hardening resin is dropped at a plurality of points along a straight line or a zigzag line, so that the liquid hardening resin can effectively be spread over the entire substrate even when the substrate is rectangular. Moreover, in the invention, although the liquid hardening resin is dropped at a plurality of points, since the liquid hardening resin portions are arranged along a straight line or a zigzag line, a gap is prevented from being left between the resin portions when the resin is spread. Consequently, the formation of bubbles is prevented and the resin can substantially uniformly be applied over the entire surface even when the substrate is rectangular. Moreover, the manufacturing cost can be reduced by such an easy bonding method.

In the invention it is preferable that when being heated, the liquid hardening resin has a viscosity lower than that at an ordinary temperature, and that a force is exerted on the substrates so that the resin between the substrates is spread while the substrates are being heated.

According to the invention, by heating the two substrates when the substrates are brought into intimate contact, the viscosity of the liquid hardening resin decreases, so that the substrates can be brought into intimate contact with the resin being thinly and uniformly spread between the substrates. Since the viscosity is high when the resin is dropped, the resin can suitably be dropped so as to convex. In the case where the viscosity is low when the resin is dropped, since the resin thinly spreads over the substrates, an air gap is formed when the substrates are brought into intimate contact, so that bubbles are formed. In the invention, however, by dropping the resin in a high viscosity condition, the resin can suitably be dropped so as to convex in a conical shape, so that the resin can be spread without any bubbles being formed. Moreover, by exerting a force on the substrates while heating the substrates, the resin can thinly be filled in the gap between the substrates.

In the invention it is preferable that when the EL-device substrate and the color filter substrate are bonded together, a liquid thermosetting resin is dropped on one substrate so as to convexly bulge, the two substrates are brought into intimate contact so that the thermosetting resin is spread to fill the gap between the substrates, the substrates are fixed by a photo-setting resin at a portion where color filters are not disposed under a condition where the EL-device substrate and the color filter substrate are positioned, and then, the substrates are heated to harden the thermosetting resin, thereby bonding the two substrates.

According to the invention, by bringing the two substrates into intimate contact after the liquid thermosetting resin is dropped onto one substrate so as to convex, the liquid thermosetting resin can be filled in the gap between the substrates without any bubbles being formed. The photo-setting resin is applied onto the portion between the substrates where the color filters are not disposed, and after the EL-device substrate and the color filter substrate are positioned by aligning the electrode pattern of the EL devices and the color filter pattern of the color filter substrate, the photo-setting resin is hardened by applying light, thereby temporarily fixing the EL-device substrate and the color filter substrate. Then, the thermosetting resin is hardened by heating, so that the substrates are bonded. Thus, since the resin can thermally be hardened after the substrates are positioned at an ordinary temperature and temporarily fixed, a problem is eliminated such that it is necessary to position the substrates while hardening the resin by heating.

In the invention it is preferable that when the EL-device substrate and the color filter substrate are bonded together, a thermosetting resin is dropped onto each of the substrates so as to convexly bulge, the two substrates are brought into intimate contact so that tops of resin portions on the substrates are in contact with each other to thereby spread the thermosetting resin to fill the gap between the substrates, the substrates are fixed by a photo-setting resin at a portion where the color filters are not disposed under a condition where the EL-device substrate and the color filter substrate are positioned, and then, the substrates are heated to harden the thermosetting resin, thereby bonding the substrates.

According to the invention, by bringing the two substrates into intimate contact so that the tops of the portions of the liquid thermosetting resin dropped on the EL-device substrate and the color filter substrate so as to convex are in contact, the resin can be filled in the gap between the substrates with the mixture of bubbles being more surely prevented. Moreover, since the color filter substrate and the EL-device substrate are temporarily fixed by the photo-setting resin under a condition where the two substrates are positioned at an ordinary temperature, it is unnecessary to perform positioning when the resin is thermally hardened.

In the invention it is preferable that when the EL-device substrate and the color filter substrate are bonded together, a thermosetting resin is dropped so as to convexly bulge on one substrate at a plurality of points along a straight line or a zigzag line, the two substrates are brought into intimate contact to spread the thermosetting resin so as to fill a gap between the substrates, the substrates are fixed by a photo-setting resin at a portion where the color filters are not disposed under a condition where the EL-device substrate and the color filter substrate are positioned, and then, the substrates are heated to harden the thermosetting resin, thereby bonding the substrates.

According to the invention, since the liquid thermosetting resin is dropped on one substrate at a plurality of points along a straight line or a zigzag line, the liquid thermosetting resin can effectively and uniformly be filled in the gap between the two substrates without any bubbles being formed even when the substrates are rectangular. Moreover, since the color filter substrate and the EL-device substrate are temporarily fixed by the photo-setting resin at an ordinary temperature in a condition where the substrates are positioned, it is unnecessary to perform positioning when the resin is thermally hardened.

In the invention it is preferable that the liquid thermosetting resin is lower in viscosity when heated than at an ordinary temperature, and that when the substrates are heated, a force is exerted on the substrates so that the resin between the substrates is spread.

According to the invention, when the resin is dropped onto the substrate at an ordinary temperature, since the viscosity is high, the resin can suitably be dropped so as to convexly bulge. Since the viscosity of the liquid hardening resin decreases when the substrates are heated, the resin is thinly and uniformly spread to fill the gap between the substrates, and when the substrates are further heated to the hardening point, the liquid thermosetting resin is hardened, so that the color filter substrate and the EL-device substrate are bonded. Thus, since the thickness of the adhesive layer is decreased, the viewing angle deterioration due to color displacements can be prevented.

The invention provides a method of bonding two substrates at least one of which is a light-transmitting substrate, comprising the steps of:

dropping a liquid hardening resin on a surface of one substrate so as to convexly bulge;

directing the surface where the resin is dropped, downward so as to face a surface of the other substrate; and bonding the substrates to each other so that the resin is spread to fill a gap between the substrates and is hardened.

According to the invention, since the liquid hardening resin is dropped onto only one surface, the manufacturing cost can be reduced, and since the substrates are bonded together with the resin dropped surface facing downward, even a low-viscosity resin can convexly be bulged effectively to bond the substrates together. Consequently, a low-viscosity resin can be used, the substrates are not distorted even when the substrates are thin, and the substrates can be bonded by thinly and uniformly spreading the resin between the substrates without any bubbles being formed.

The invention provides a method of bonding two substrates at least one of which is a light-transmitting substrate, comprising the steps of:

interposing a liquid hardening resin between the substrates;

spreading the liquid hardening resin between the substrates by use of a capillary phenomenon of the resin; and hardening the resin thereafter.

According to the invention, the liquid hardening resin is spread to fill the gap between the substrates by the capillary phenomenon. That is, since the gap between the substrates is extremely small, when the liquid hardening resin is interposed between the substrates, the resin spreads over the entire surfaces of the substrates by the capillary phenomenon due to the surface tension of the resin. Since the surface tension causes a force to act in a direction that brings the substrates into intimate contact, a force is exerted in the direction that brings the two substrates into intimate contact with each other without an external force being exerted on the substrates. When the resin is dropped onto the surface of the substrate and the two substrates are bonded together, the resin dropped portion concaves when the substrate is thin. However, since resin is discharged from the concaved resin dropped portion in the process of spread of the resin to the periphery due to the capillary phenomenon, the concave is reduced at the resin dropped portion, so that the substrate becomes flat. As the method of interposing the resin between the substrates, a method in which the resin is dropped onto the peripheries of two substrates being in intimate contact and the resin is spread between the substrates can be used in addition to the method in which the resin is dropped on the surface of the substrate and the substrates are bonded together.

In the invention it is preferable that the liquid hardening resin is a thermosetting resin, and a viscosity of the resin at an ordinary temperature is higher than that of the resin thermally hardened.

According to the invention, by using a thermosetting resin whose viscosity at an ordinary temperature is higher than that of the thermally hardened resin, the viscosity is high when the resin is dropped, so that the resin can effectively be dropped so as to convexly bulge. When the two substrates are bonded together under this condition and heated, the viscosity of the resin between the substrates decreases, so that the resin is thinly spread between the substrates. When the substrates are further heated to the hardening temperature, the substrates can be bonded with the resin being thermally hardened in a thinly spread condition. Thus, the substrates can be bonded by thinly spreading the resin between the substrates with the mixture of bubbles being surely prevented.

In the invention it is preferable that a spacer of a predetermined grain diameter is interposed between the substrates.

According to the invention, since the spacer of the predetermined grain diameter is interposed between the substrates, a predetermined distance can be maintained between the substrates. When the resin between the substrates spreads, a force acts by the surface tension in a direction that brings the substrates into intimate contact as mentioned above. However, when the substrates are in absolute contact, the resin is prevented from spreading. On the contrary, according to the invention, the substrates are prevented from being in absolute contact by interposing the spacer between the substrates, so that the resin can smoothly be spread between the substrates.

In the invention it is preferable that the spacer is fixed to the surface of one substrate in advance, and the substrates are bonded together thereafter.

According to the invention, since the spacer is fixed to the surface of one substrate in advance and the substrates are bonded together thereafter, the productivity is excellent. Moreover, since the spacer is fixed in advance, the spacer can be prevented from dropping when the substrates are bonded together.

In the invention it is preferable that the grain diameter of the spacer is not less than 10 $\mu$m.

According to the invention, the grain diameter of the spacer is not less than 10 $\mu$m. When there is a local concave portion in the surface of the substrate and the difference between the substrate-to-substrate distance at the concave portion and the substrate-to-substrate distance at the periphery thereof is large, the speed of spread of the resin is different between at the local concave portion and at the periphery, so that a bubble is left in the local concave portion. In the invention, by interposing the spacer with a grain diameter of not less than 10 $\mu$m, the difference in substrate-to-substrate distance between at the local concave portion and at the periphery thereof can be reduced, so that the resin substantially uniformly spreads. As a result, the formation of bubbles can be surely prevented.

In the invention it is preferable that when an area of a range between the substrates to be filled with the resin is S and the grain diameter of the spacer is d, an amount D of the liquid hardening resin inserted between the substrates is selected so as to fall within the following range:

$$S \cdot d < D < S \cdot (d+12 \, \mu m).$$

According to the invention, the amount of the dropped resin is selected so as to fall within the above-mentioned range. When the amount of the dropped resin is too large, the resin is filled in the entire gap between the substrates before the resin is sufficiently discharged from the resin dropped portion, so that the spread of the resin due to the capillary phenomenon stops. Then, excessive resin is left in the resin dropped portion and causes a distortion in the substrate as a concave. When the amount of the dropped resin is too small, the resin cannot completely be filled in the gap to be filled with the resin. Therefore, it is necessary that an appropriate amount of resin be filled between the substrates. Since the substrate-to-substrate distance is maintained constant by interposing the spacer between the substrates, ideally, the amount D of the resin inserted between the substrates is $$D = S \cdot d.$$

When the resin of the amount satisfying the expression is inserted between the substrates, an appropriate amount of resin is filled in the gap between the substrates, so that no concave is caused in the resin dropped portion and no bubbles are formed. However, since there are local asperities on the surfaces of the substrates in actuality, it is necessary that the amount of the dropped and inserted resin vary. As a result of an examination, the inventor found that when the amount satisfies the following condition, only a distortion that becomes no problem is caused although the amount is larger than the ideal amount:

$$D < S \cdot (d + 12 \ \mu m).$$

Moreover, to fill the range between the substrates to be filled with the resin, the resin of an amount larger than the ideal amount is necessary. Therefore, it is necessary that the amount D of the resin to be inserted satisfy the following condition:

$$S \cdot d < D.$$

In the invention it is preferable that one of the two substrates is a light-transmitting EL-device substrate, the El device substrate, having a first light-transmitting electrode, an EL light emission layer and a second electrode formed on one surface thereof, and emitting EL light from the other surface; and that the other substrate of the two substrates is a light-transmitting color filter substrate and has color filters disposed on one surface thereof.

According to the invention, by bonding the EL-device substrate and the color filter substrate by the above-described substrate bonding methods, an EL display apparatus can be manufactured in which the distortion of the substrates and the formation of bubbles are prevented and the display quality is not deteriorated.

BRIEF DESCRIPTION OF THE DRAWINGS

Other and further objects, features, and advantages of the invention will be more explicit from the following detailed description taken with reference to the drawings wherein:

FIG. 3 is a schematic view of a cross section of a typical two-substrate-bonded-type color EL panel;

FIGS. 11A and 11B are plan views showing a condition in which resin is dropped onto the EL-device substrate 224;

FIG. 12 is a cross-sectional view showing a condition of the color EL display apparatus 220 at the time of heating;

DETAILED DESCRIPTION OF THE PREFERRED EMBODIMENTS

Figure 1:
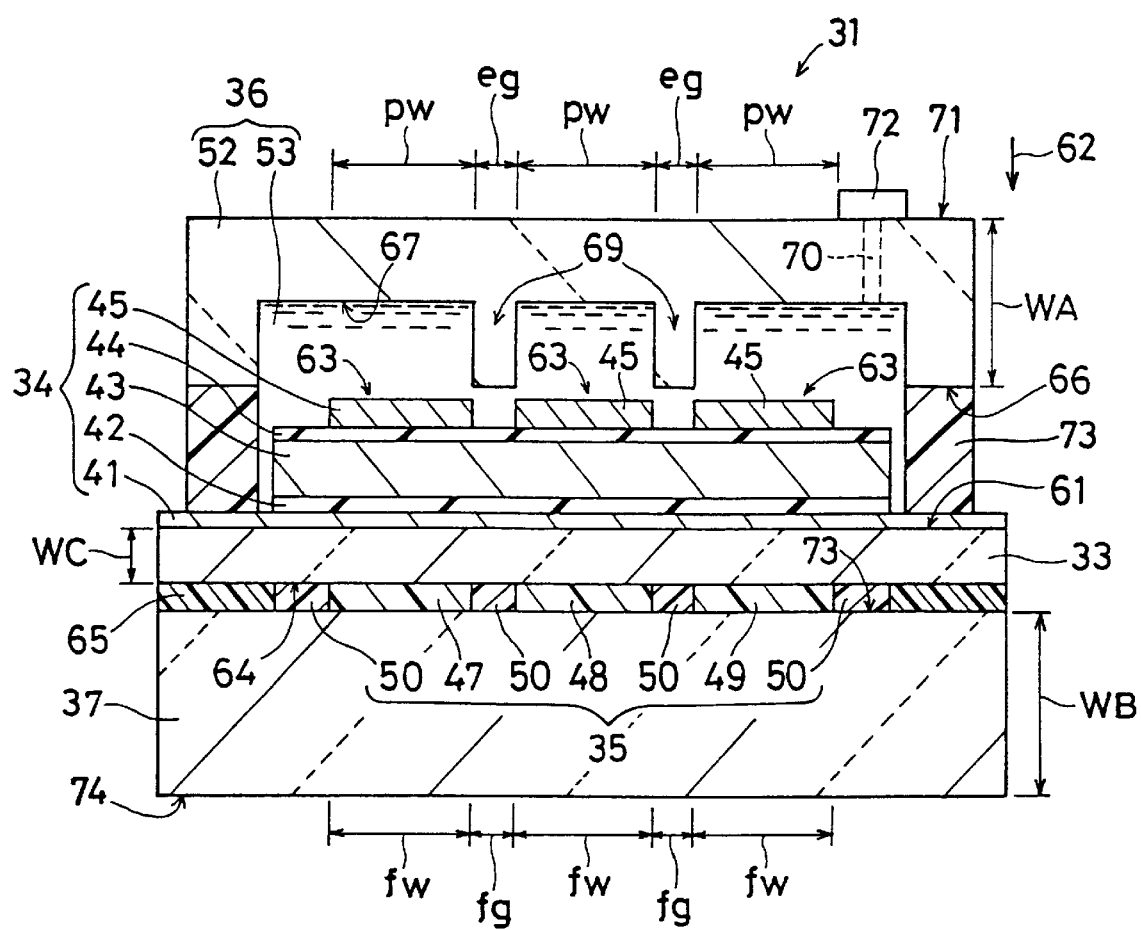
FIG. 1 is a cross-sectional view of a color EL display apparatus 31 manufactured by a color EL display apparatus manufacturing method according to a first embodiment of the invention.

Now referring to the drawings, preferred embodiments of the invention are described below.

Figure 2:
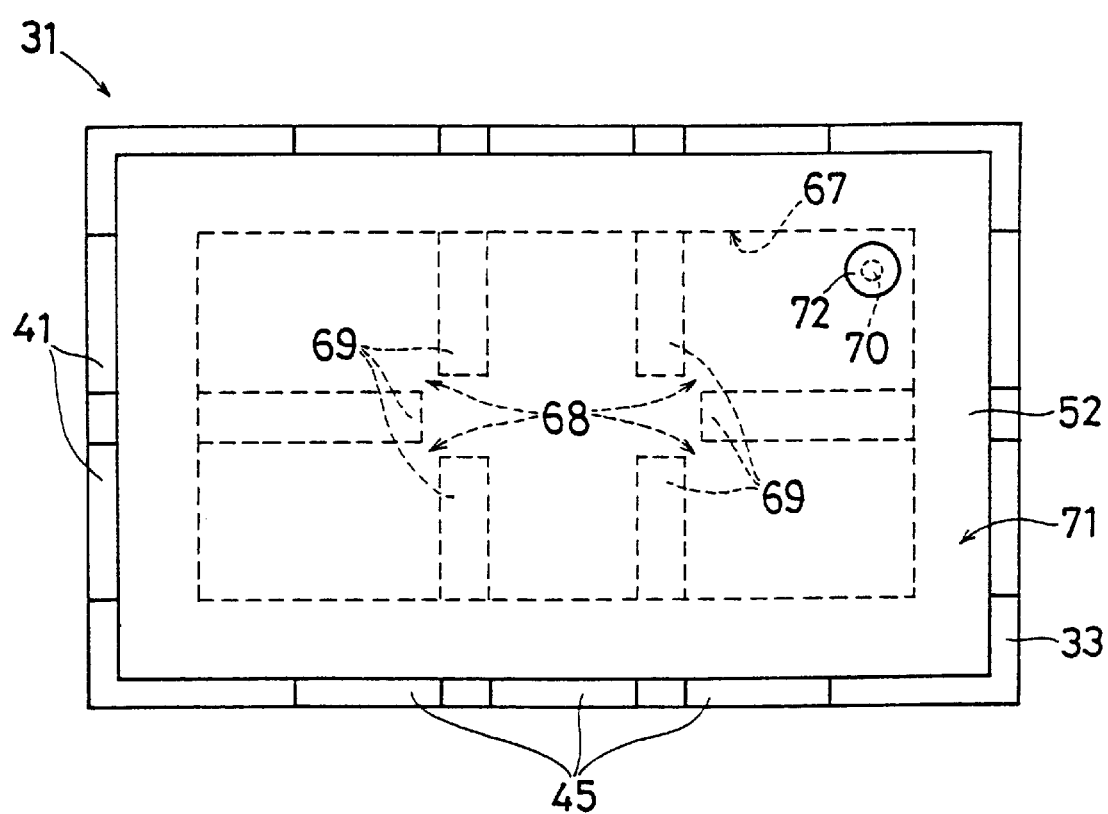
FIG. 2 is a plan view of the color EL display apparatus 31.

FIG. 1 is a cross-sectional view of a color EL display apparatus 31 manufactured by a color EL display apparatus manufacturing method according to a first embodiment of the invention. FIG. 2 is a plan view of the color EL display apparatus 31. FIGS. 1 and 2 will be described together.

The color EL display apparatus 31 comprises a main substrate 33, an EL device portion 34, a color filter portion 35, a sealing portion 36 and a reinforcing substrate 37. The EL device portion 34 comprises a plurality of lower electrodes 41, a lower insulation layer 42, a light emission layer 43, an upper insulation layer 44 and a plurality of upper electrodes 45. The color filter portion 35 comprises one or a plurality of red filters 47, one or a plurality of green filters 48, one or a plurality of blue filters 49 and a light intercepting filter 50. The red, green and blue filters 47 to 49 will sometimes be generically called "color filters". The sealing portion 36 comprises a sealing substrate 52 and a protective material layer 53.

The thickness of the main substrate 53 is a predetermined reference thickness WC. The reference thickness WC is smaller than the thickness of the substrate where the thin-film EL devices are formed in a typical color EL display apparatus. As described later, the thickness of the main substrate 33 is larger than the reference thickness WC when the EL device portion 34 and the sealing portion 36 are formed, and after the EL device portion 34 and the sealing portion 36 are formed, the main substrate 33 is processed so as to have the reference thickness WC.

The lower electrodes 41 are film strips. The upper electrodes 45 are also film strips. All the lower electrodes 41, the lower insulation layer 42, the light emission layer 43, the upper insulation layer 44 and all the upper electrodes 45 are laminated on one surface 61 of the main substrate 33 in this order from below. The lower electrodes 41 are all arranged in parallel with one another on the one surface 61 of the main substrate 33. The lower electrodes 41 are disposed at intervals of a predetermined width from the adjacent lower electrodes 41. The upper electrodes are all arranged in parallel with one another on a surface of the upper insulation layer 44. The upper electrodes 45 are disposed at intervals of a predetermined width eg from the adjacent upper electrodes 45. The direction of length of the lower electrodes 41 and the direction of length of the upper electrodes 45 are perpendicular to each other when viewed from the direction of the normal 62 to the one surface 61 of the main substrate 33. That is, the EL device portion 34 has a so-called direct matrix structure.

In the EL device portion 34, the portions where the lower electrodes 41 and the upper electrodes 45 intersect when viewed from the direction of the normal 57 are the thin-film EL devices 63. Consequently, when an alternating field is applied between the lower electrodes 41 and the upper electrodes 45, the portion of the light emission layer 43 that is sandwiched between the lower electrodes 41 and the upper electrodes 45 emits light. Also, the thin-film EL devices 63 are all arranged in a matrix on the one surface 61 of the main substrate 33. The thin-film EL devices 63 have the so-called double insulation structure.

The color filters 47 to 49 are film strips. The red, green and blue filters 47 to 49 transmit only light beams of the wavelengths of red, green and blue, respectively. The color filters 47 and 49 transmit light beams of different wavelengths and have the same configuration. The upper electrodes 45 are each in a one-to-one correspondence with one of the color filters 47 to 49. The one of the color filters is disposed in a position opposed to the corresponding upper electrode 45 with the main substrate 33 in between within the other surface 64 of the main substrate 33. Consequently, the color filters 47 to 49 are disposed on the other surface 64 of the main substrate 33 in parallel with one another at intervals of a predetermined width fg from the adjacent color filters 47 to 49. Also, the direction of length of the color filters 47 to 49 is parallel to the direction of length of the upper electrodes 45. The color filters 47 to 49 may be in a one-to-one correspondence with the lower electrodes 41. In this case, the direction of length of the color filters 47 to 49 is parallel to the direction of length of the lower electrodes 41.

The light intercepting filter 50 covers the portions between the color filters 47 to 49 within the other surface 64 of the main substrate 33 and the periphery of the color filter being closest to the end of the other surface 64. The light intercepting filter 50 is a so-called black mask. By the provision of the light intercepting filter 50, the contrast of the color EL display apparatus 31 is superior to that of a color EL display apparatus having no light intercepting filter, and the legibility is improved.

The reinforcing substrate 37 is fixed by an adhesive layer 65 to the other surface 64 of the main substrate 33 with the color filter portion 35 in between. Consequently, the color filter portion 35 is sandwiched between the other surface 64 of the main substrate 33 and one surface 73 of the reinforcing substrate 37.

One surface 66 of the sealing substrate 52 and the one surface 61 of the main substrate 33 are opposed to each other, and the sealing substrate 52 and the main substrate 33 are fixed by an adhesive layer 73. In the one surface 66 of the sealing substrate 52, a concave portion 67 is formed. The inner configuration of the concave portion 67 is a substantially rectangular parallelepiped. Inside the concave portion 67, lattice-form spacers 69 having slits 68 are left. While the inner space of the concave portion 67 is divided into a plurality of parts by the spacers 69, the parts communicate with at least one of the other parts through the slits 68. Consequently, the inner space of the concave portion 67 is continuous. The sealing substrate 52 has a filling hole 70 communicating with the inner space of the concave portion 56. The filling hole 70 is closed by a sealing member 72 from the other surface 71 of the sealing substrate 52.

The protective material layer 53 is formed by filling a protective material into the gap between the sealing substrate 52 and the main substrate 33, that is, the inner space of the concave portion 67. The protective material is realized, for example, by a mixture of silica gel and silicone oil. The EL device portion 34 is placed in the gap. Consequently, the protective material covers the surface of the EL device portion 34. Ends of the lower electrodes 41 and ends of the upper electrodes 45 are exposed out of the sealing portion 36 as terminals of the lower and the upper electrodes 41 and 45.

Of the above-described parts of the color EL display apparatus 31, at least the main substrate 33, the reinforcing substrate 37, the lower electrodes 41 and the lower insulation layer 42 transmit light. The red, blue and green filters 47 to 49 transmit only light beams of the wavelengths of red, blue and green, respectively. The light intercepting filter 50 intercepts light. It is desirable that the upper electrodes 45 be made of a material having conductivity and being capable of reflecting light because the upper electrodes 45 also serve as reflecting plates. When an electric field is created between the lower electrodes 41 and the upper electrode 45, the light emission layer 43 emits so-called white light by electroluminescence. Specifically, the light emission layer 43 is formed by laminating a first light emission layer and a second light emission layer. The first light emission layer made of SrS to which Ce is added (SrS:Ce) emits blue-green light by electroluminescence. The second light emission layer made of ZnS to which manganese (Mn) is added (ZnS:Mn) emits golden yellow light by electroluminescence. Consequently, the light emitted from the entire light emission layer 43 is white light. Consequently, in the color EL display apparatus 31, the other surface 74 of the reinforcing substrate 37 is the display screen.

The method of manufacturing the color EL display apparatus 31 will be described below. The main substrate 33 is realized by a glass substrate such as OA-2 (manufactured by Nippon Electric Glass Co., Ltd.). The initial width WD of the main substrate 33 which is larger than the reference width WC is, for example, 0.7 mm.

First, a light-transmitting thin film of a conductive material is formed on the one surface 61 of the main substrate 33. The conductive material is, for example, ITO (indium-tin oxide), or ZnO to which aluminum is added (ZnO:Al). The thickness of the thin film is not less than 100 nm and not more than 400 nm. As the method of forming the thin film, for example, the sputtering method, the electron beam vapor deposition method or the spraying method is used. Then, the thin film is patterned so as to be striped by so-called photo-etching. Consequently, all the lower electrodes 41 are formed on the one surface 61 of the main substrate 33.

Then, a light-transmitting thin film made of an insulating material is formed as the lower insulation layer 42 on the surfaces of all the lower electrodes 41 and the exposed portion of the one surface 61 of the main substrate 33. The insulating material is, for example, $SiO_2$, SiN, $Ta_2O_5$ or $SrTiO_3$. The thickness of the lower insulation layer 42 is, for example, not less than 200 nm and not more than 500 nm. As the method of forming the insulation layer 42, for example, the sputtering method is used. At least the ends of the lower electrodes 41 are not covered with the lower insulation layer 42. The portions of the lower electrodes 41 not being covered with the lower insulation layer 42 serve as the terminals of the lower electrodes 41.

Then, the light emission layer 43 is formed. Specifically, first, the substrate 33 is held at a temperature not less than 450° C. and not more than 650° C., and film formation by use of the electron beam vapor deposition method is performed with an SrS:CeN pellet as the evaporation source. Consequently, the first light emission layer is formed on the lower insulation layer 42. The thickness of the first light emission layer is, for example, not less than 800 nm and not more than 1500 nm. Then, the substrate 33 is held at a temperature not less than 200° C. and not more than 300° C., and film formation by use of the electron beam vapor deposition method is performed with a ZnS:Mn pellet as the evaporation source. Consequently, the second light emission layer is formed on the first light emission layer. The thickness of the second light emission layer is not less than 200 nm and not more than 500 nm. The SrS:CeN pellet is formed by firing SrS to which CeN of not less than 0.05 wt % and not more than 0.3 wt % is added. The ZnS:Mn pellet is ZnS to which Mn of not less than 0.2 wt % and not more than 0.6 wt % is added. The light emission layer 43 is formed by the above-described process.

Then, a thin film made of an insulating material is formed on the light emission layer 43 as the upper insulation layer 44. The thickness, the material and the forming method of the upper insulation layer 44 are, for example, the same as those of the lower insulation layer 42. After the formation of the upper insulation layer 44, the substrate 33 is heat-treated in a vacuum in order to improve the crystallinity of the light emission layer 43 formed by the electron beam vapor deposition method. The heating temperature of the heat treatment is, for example, not less than 600° C. and not more than 650° C. The heating time of the heat treatment is, for example, not less than one hour and not more than two hours.

Then, a thin film of a conductive material is formed so as to cover the surface of the upper insulation layer 44 and the exposed portion of the one surface 61 of the main substrate 33. The conductive material is, for example, aluminum (Al). The thickness of the thin film is, for example, 100 nm to 500 nm. Then, the thin film is patterned so as to be striped by so-called photo-etching. Consequently, all the upper electrodes 45 are formed on the upper insulation layer 44. The upper electrodes 45 extend over the one surface 61 of the substrate 33 beyond ends of the upper insulation layer 44. The portions of the upper electrodes 45 situated on the substrate 33 serve as the terminals of the upper electrodes 45. By the process from the formation of the lower electrodes to the formation of the upper electrodes 45, the EL device portion 34 is formed on the one surface 61 of the main substrate 33.

In parallel with the above-described formation of the thin-film EL devices or following the formation, the one surface 66 of the sealing substrate 52 is etched by use of hydrofluoric acid. Consequently, the concave portion 67 is formed in the surface of the sealing substrate 52. The sealing substrate is made of, for example, glass. The thickness WA of the sealing substrate 52 is, for example, 1.8 mm. The depth of the concave portion 67 is, for example, 0.7 mm. Then, a filling hole 70 is formed in the sealing substrate 52.

Then, with the one surface 61 of the main substrate 33 and the one surface 66 of the sealing substrate 52 being opposed to each other, the one surface 61 of the main substrate 33 and the periphery of the one surface 66 of the sealing substrate 52 are bonded by use of an adhesive. The adhesive which is realized, for example, by epoxy resin becomes the adhesive layer 73 after being hardened. In this case, for example, the terminals of the lower electrodes 41 and the terminals of the upper electrodes 45 are not opposed to the sealing substrate 52 but are exposed.

After the bonding of the substrates 33 and 52, air is exhausted from the gap between the main substrate 33 and the sealing substrate 52, that is, the inner space of the concave portion 67, so that the gap is evacuated. Then, the whole of the main substrate 33 with the sealing substrate 52 bonded thereto is immersed in a protective material liquid filled in a bath prepared in a chamber. The protective material liquid is a mixture of silica gel and silicone oil. The weight percentage of silica gel in the protective material liquid is 25 wt %. Then, the chamber is filled with nitrogen ($N_2$). Consequently, the protective material liquid is filled into the gap. After the gap is filled with the protective material liquid, the filling hole 70 is closed by the sealing member 72. By the process from the processing of the sealing substrate 52 to the closing of the filling hole 70, the sealing portion 36 is completed.

Then, the portion within the outer surface of the main substrate 33 other than the other surface 64, and the outer surface of the sealing portion 36 are covered with an etching-resistant resist. The portion is, for example, the portion within the one surface 61 of the main substrate 33 where the terminals of the lower and the upper electrodes 41 and 45 are formed. Then, the other surface 64 of the main substrate 33 is etched by a wet etching method using an etchant whose main component is hydrofluoric acid until the thickness of the substrate 33 becomes the reference thickness WC. The reference thickness WC is, for example, 75 μm.

After the etching of the main substrate 33, the red filter 47, the green filter 48 and the blue filter 49 are formed by photolithography so as to be striped, to be in parallel with one another and to be spaced on the other surface 64 of the main substrate 33. Then, the light intercepting filter 50 is formed on the other surface 64 of the main substrate 33. Consequently, the color filter portion 35 is completed. The red filter 47 is realized, for example, by CR-7001 manufactured by FUJI-HUNT. The green filter 48 is realized, for example, by CG-7001 manufactured by FUJI-HUNT. The blue filter 49 is realized, for example, by CB-7001 manufactured by FUJI-HUNT. The light intercepting filter 50 which is a so-called black filter is realized, for example, by CK-7001 manufactured by FUJI-HUNT.

Lastly, the reinforcing plate 37 is bonded to the other surface 64 of the main substrate 33 with the color filter portion 35 in between, for example, by use of a fluid photobond. The photobond becomes the adhesive layer 65 after being hardened. By the above-described process, the color EL display apparatus 31 is completed.

Figure 3:
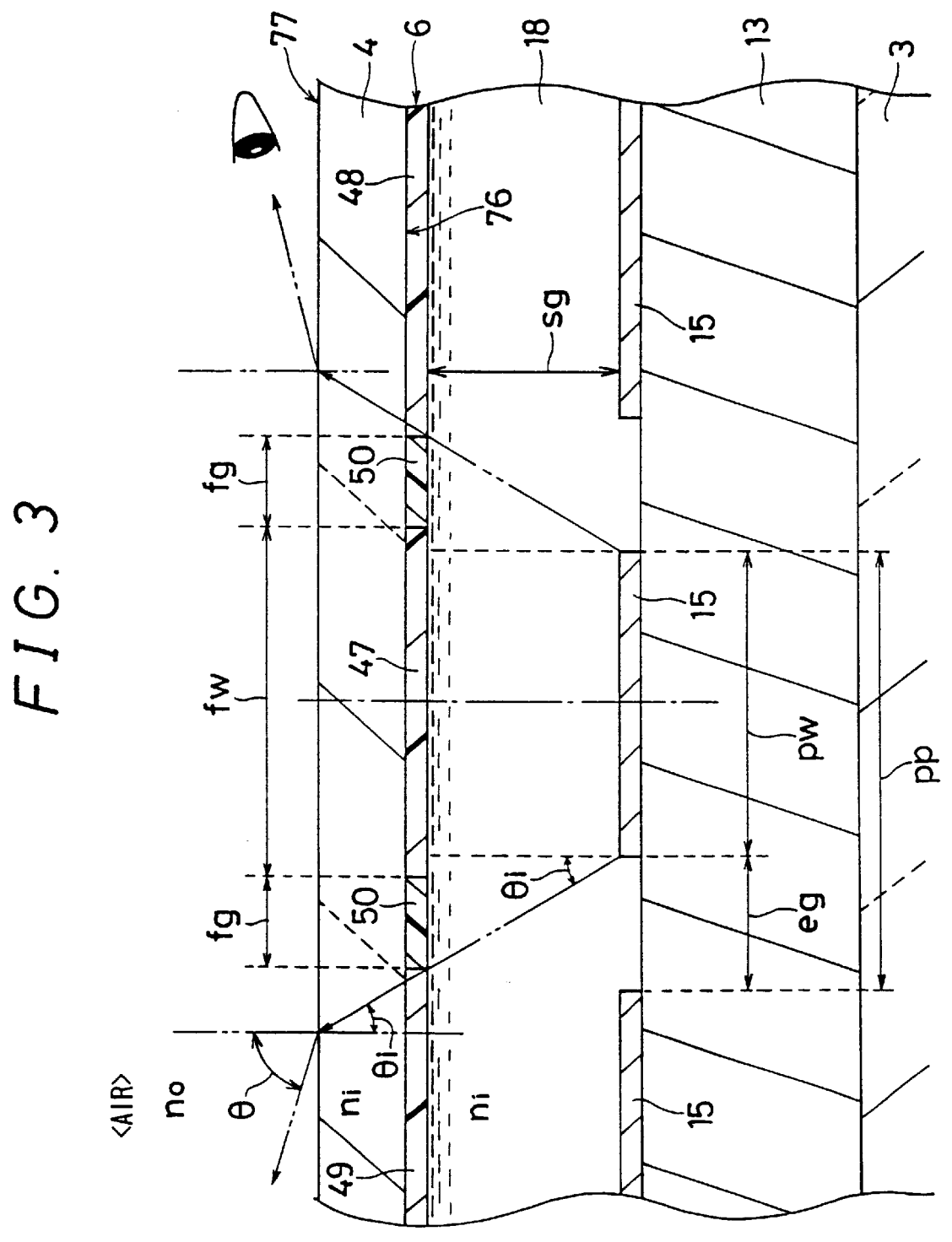
Figure 20:
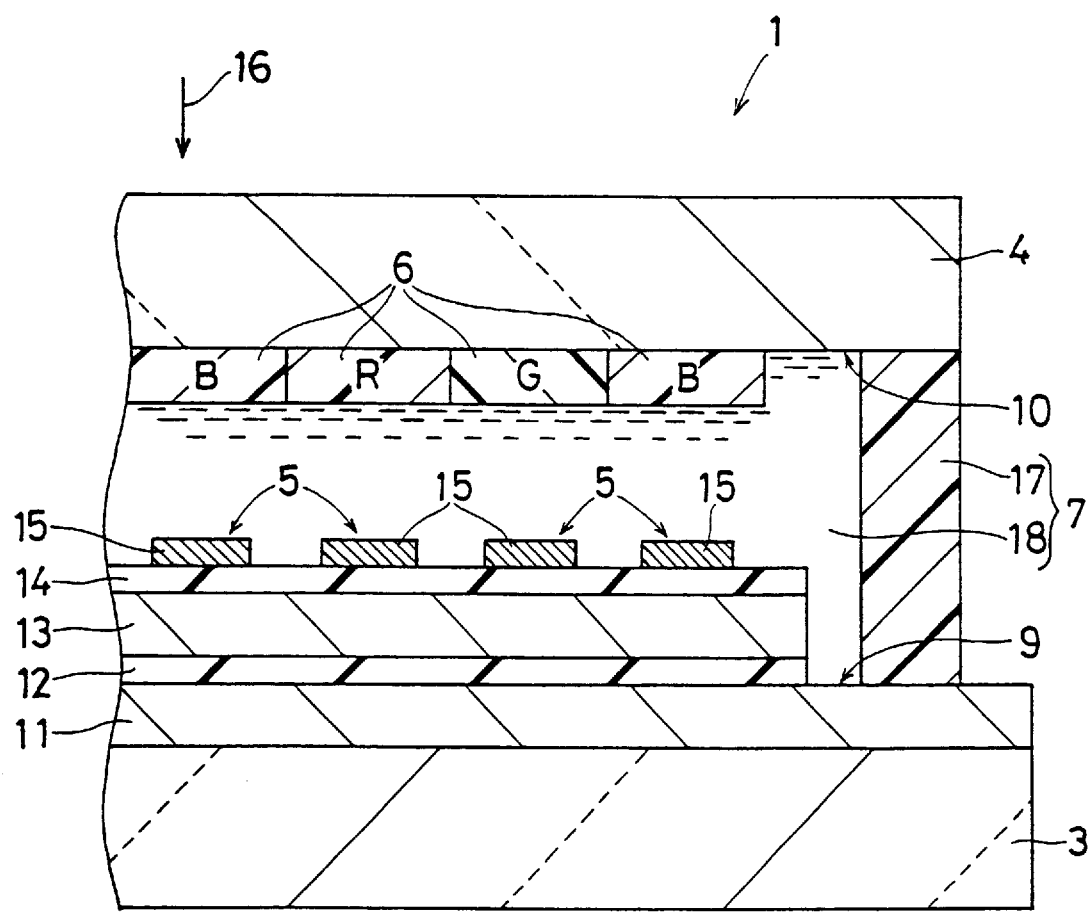
FIG. 20 is an enlarged partial cross-sectional view of the color EL display apparatus 1 according to the third prior art.

FIG. 3 is a schematic view of a cross section of a typical two-substrate-bonded-type color EL panel. Since the color EL panel is the same as the panel disclosed in Japanese Unexamined Patent Publication JP-A 64-40888 (1989) described in the prior art, the same reference numerals as those of FIG. 20 are used and the description of the structure thereof is omitted. Since the color filter portion of this panel has the same structure as the color filter portion 35 of the color EL display apparatus 31 of FIG. 1, the reference numerals of FIG. 1 are used and the description of the structure thereof is omitted. In FIG. 3, the lower and the upper insulation layers 12 and 14 and the lower electrodes 11 are not shown. Between the substrate 3 and the light-transmitting substrate 4, silicone oil is filled as the protective material.

The viewing angle of the color EL panel of FIG. 3 will hereinafter be described.

Generally, when light successively passes through two spaces filled with media having different refractive indices, Snell's law holds between the angle of incidence of light and the angle of refraction of light at the interface surface of the two spaces. The light emitted from the light emission layer 13 is not refracted at an interface surface 76 between the light-transmitting substrate 4 and the protective material layer 18 since glass and silicone oil have the same refractive index. Moreover, it is assumed that the light travels in a straight line through the upper electrodes 15, the upper insulation layer 14 and the color filter portion since the upper electrodes 15, the upper insulation layer 14 and the color filter portion are sufficiently thinner than the light-transmitting substrate 4 and the protective material layer 18. Therefore, the light is refracted at the interface surface 77 between the light-transmitting substrate 4 and the air layer only when exiting from the inside of the color EL panel into the air.

The relationship of an expression 1 holds between the angle of incidence $\theta i$ of the light emitted from the light emission layer 13 on an interface surface 77 and the angle of refraction $\theta$ of the light at the interface surface 77. The viewing angle $\theta a$ of the color EL panel is twice the angle of refraction $\theta$. Therefore, the viewing angle $\theta a$ is obtained by an expression 2. The viewing angle $\theta a$ is a screen angle where there is no change in tonality. The screen angle is the angle at which the user of the color EL panel views the display screen of the color EL panel, that is, the interface surface 77 when the user views the display screen. The viewing angle $\theta a$ is sometimes expressed, when it is assumed that the normal to the interface surface 77 is 0°, by a positive value in the clockwise direction and by a negative value in the counterclockwise direction with the intersection of the normal and the interface surface as the center within a virtual plane including the normal.

In the expressions shown below, "no" is the refractive index of air. "ni" is the refractive index of the glass and the silicone oil, and is, for example, 1.5. "fw" is the width of the color filters 47 to 49. "fg" is the width of the interval between adjacent two color filters. The width fg equals the width of the light intercepting filter 50. "pw" is the width of an EL light emission area. The EL light emission area is an area immediately below the upper electrodes 15 in the light emission layer 13. The width of the EL light emission area and the width of the upper electrodes 15 are the same. "sg" is the thickness of the protective material layer 18. The width sg equals the interval between the color filter portion and the upper electrodes 15. "eg" is the width of the interval between one electrodes of pairs of electrodes of the thin-film EL devices the direction of length of which electrodes is parallel to that of the color filters 47 and 49, that is, the width of the interval between two adjacent upper electrodes 15. To maximize the viewing angle $\theta a$ of the color EL panel, the width fw of the color filters 47 to 49 and the width pg of the electrodes are made the same as shown by an expression 3 and the width fg of the intervals between the filters and the width eg of the intervals between the upper electrodes 15 are made the same as shown by an expression 4.

$$\frac{\sin\theta i}{\sin\theta} = \frac{no}{ni} \quad (1)$$

$$\theta a = \pm \arcsin\left(\frac{ni}{no} \times \sin\theta i\right) \quad (2)$$

$$= \pm \arcsin\left[\frac{\frac{ni}{no} \times \left(\frac{fw}{2} + fg - \frac{pw}{2}\right)}{\left\{\left(\frac{fw}{2} + fg - \frac{pw}{2}\right)^2 + (sg)^2\right\}^{1/2}}\right]$$

$$fw = pw \quad (3)$$

$$fg = eg \quad (4)$$

$$fw = pw \quad (3)$$

$$fg = eg \quad (4)$$

The ingredients of the silicone oil are mixed so that the refractive index is substantially the same as the refractive index of the substrates 3 and 4. Therefore, by replacing the protective material layer 18 by the main substrate 33, replacing the substrate 4 by the reinforcing substrate 37, replacing the color filter portion by the color filter portion 35 and replacing the thin-film EL devices 5 by the thin-film EL devices 63, the behavior of the light emitted from the light emission layer 43 in the color EL display apparatus 31 of this embodiment can be explained based on the same idea as the behavior of the light in the color EL panel of FIG. 3. Therefore, the after-processing thickness of the main substrate 33, that is, the reference thickness WC will be described based on the expressions (2) to (4).

When the viewing angle $\theta a$ is decided, the relationship between the width fg of the intervals between the color filters 47 to 49 and the thickness sg of the protective material 18 is found based on the expression 2. When it is assumed that the width fg of the intervals between the color filters 47 to 49 and the width eg of the intervals between the upper electrodes 15 are the same as shown by the expression 4, the relationship between the width eg of the intervals between the upper electrodes 15 and the thickness sg of the protective material layer 18 is found based on the expression 2. Table 1 shows the relationship between the width eg of the intervals between the upper electrodes 15 and the thickness sg of the protective material layer 18 when the viewing angle θa is 160° (±80°). Table 2 shows the relationship between the width eg of the intervals between the upper electrodes 15 and the thickness sg of the protective material layer 18 when the viewing angle θa is 80° (±40°). The viewing angle of 160° is required, for example, when the color EL display apparatus 31 is used in a so-called wide viewing angle mode. The viewing angle of 80° is required, for example, when the color EL display apparatus 31 is used as a display screen of a personal computer for private use.

TABLE 1

| Width of intervals between electrodes ($\mu$m) | Thickness of protective material layer ($\mu$m) |
| --- | --- |
| 25 | 30 |
| 50 | 60 |
| 100 | 120 |
| 150 | 180 |
| 200 | 240 |
| 250 | 300 |

TABLE 2

| Width of intervals between electrodes ($\mu$m) | Thickness of protective material layer ($\mu$m) |
| --- | --- |
| 25 | 55 |
| 50 | 110 |
| 100 | 220 |
| 150 | 330 |
| 200 | 440 |
| 250 | 550 |

When the above-mentioned idea in the color EL panel is applied to the color EL display apparatus 31 of this embodiment, the thickness sg of the protective material layer 18 corresponds to the after-processing thickness of the main substrate 33, that is, the reference thickness WC. Therefore, when the viewing angle required by the color EL display apparatus 31 is decided, the width of the interval between one electrodes of pairs of electrodes 41 and 45 of the thin-film EL devices 63 the direction of length of which electrodes is parallel to the color filters 47 and 49, that is, the width eg of the intervals between the upper electrodes 45 is a factor that decides the reference thickness WC. From the tables, it is apparent that when the width eg of the intervals between the upper electrodes 45 is the same, the wider the viewing angle is, the smaller the thickness sg of the protective material layer 18 is. Therefore, in order that the viewing angle is not less than 160°, it is necessary that the reference thickness WC be not more than 1.2 times the width eg of the intervals between the electrodes.

The color EL display apparatus 31 has the so-called direct matrix structure. That is, a plurality of strip-form lower and upper electrodes 41 and 45 alternately intersect to form a so-called XY matrix. The electrode pitch pp of the upper electrodes 45 is the sum of the width pw of the upper electrodes 45 and the width eg of the intervals between the upper electrodes 45. For example, in a currently-used typical EL panel, when the electrode pitch pp is 0.3 mm (300 $\mu$m), the width pw of the upper electrodes 45 is 210 $\mu$m and the width eg of the intervals between the upper electrodes 45 is 90 $\mu$m.

When the component ratio between the width pw of the upper electrodes 45 and the width eg of the intervals between the upper electrodes 45 is decided, the fill factor of the color EL display apparatus 31 is also decided. For example, when the electrode pitch pp is 0.3 mm, the width pw of the upper electrodes 45 is 210 $\mu$m and the width eg of the intervals between the upper electrodes 45 is 90 $\mu$m, it is found from the expression (5) that the fill factor is 0.49. The fill factor influences the panel screen brightness of the EL panel, that is, the brightness of the display screen of the color EL display apparatus 31. For example, it is found from the expression (6) that the panel screen brightness of an EL panel using EL devices having a light emission brightness characteristic of 100 cd/m$^2$ is 49 cd/m$^2$.

$$(210 \div 300) \times 210 \div 300 = 0.49 \quad (5)$$

$$100[cd/m^2] \times 0.49 = 49 [cd/m^2] \quad (6)$$

Therefore, in order to improve the panel screen brightness of the color EL display apparatus 31, it is necessary to maximize the fill factor. Consequently, it is desired to minimize the width eg of the intervals between the upper electrodes 45. Considering typical uses of the color EL panel, the color EL display apparatus 1 is required to provide display of as high resolution as possible. Consequently, the electrode pitch pp of the color EL display apparatus 31 is frequently set to not less than 0 and not more than 0.5 mm. In this case, further considering the fill factor, the width eg of the intervals between the upper electrodes 45 is set to approximately not less than 50 $\mu$m and not more than 150 $\mu$m. When the electrode pitch pp and the width eg of the intervals between the upper electrodes 45 are decided as mentioned above, in order that the viewing angle θa of the color EL display apparatus 31 is wide, that is, not less than 160°, it is necessary that the after-processing thickness of the main substrate 33 be not more than 180 $\mu$m. The thinner the main substrate 33 is, the higher the possibility is that the main substrate 33 breaks at a portion of after processing of the main substrate 33 in the manufacturing process of the color EL display apparatus 31. Considering the processing accuracy in the processing of the main substrate 33, an error of ±10 $\mu$m from the reference thickness WC is caused in the after-processing thickness of the main substrate 33. For this reason, when the reference thickness is less than 25 $\mu$m, there is no margin. From the above, theoretically, it is desirable that the reference thickness WC be not less than 25 $\mu$m and not more than 200 $\mu$m.

In actual EL panels, as shown in FIG. 3, the width fw of the color filters 47 to 49 is frequently larger than the width pw of the upper electrodes 45, and the width fg of the intervals between the color filters 47 to 49 is frequently smaller than the width eg of the intervals between the upper electrodes 45. Since the width eg between the intervals of the electrodes is smaller than that in the above-described example for this reason, it is desired that the reference thickness WC of the main substrate 33 be smaller than the above-mentioned theoretical thickness. Further, in the method of manufacturing the color EL display apparatus 31 according to this embodiment, a chemical etching method using an etchant of hydrofluoric acid is used as the method of thinning the main substrate 33. In the case where the chemical etching method is used, an etching error of approximately ±10 $\mu$m is caused even when the etching conditions are held optimum. From these, although it is desired from the viewpoint of the viewing angle that the after-processing thickness of the main substrate 33 be as small as possible, from the viewpoint of handling of the substrate after the processing, it is necessary that the after-processing thickness be at least approximately 50 $\mu$m as the practical design level. Moreover, considering the electrode pitch of the currently-used EL panel, in order to obtain the viewing angle of 80°, it is necessary that the after-processing thickness of the main substrate 33 be not more than 100 μm. From the above, it is desired that the reference thickness WC of the main substrate 33 be not less than 50 μm and not more than 100 μm from a practical point of view.

The initial thickness WD of the main substrate 33 and the thickness WA of the sealing substrate 52 will hereinafter be described.

The EL display portion 34 has a structure such that the lower and the upper electrodes 41 and 45, the lower and the upper insulation layers 42 and 44 and the light emission layer 43 are laminated. Consequently, a multiplicity of thin film pieces are laminated on the main substrate 33. Stress exists inside each of the film pieces. Therefore, as the main substrate 33 is thinned, the main substrate 33 warps in accordance with the stress inside the film pieces. Since the internal stress acts in a direction that extends the film pieces in many cases, the main substrate 33 frequently warps in a direction that convexes the surfaces of the films.

In order to examine the relationship between the thickness of the main substrate 33 and the warp of the main substrate 33, a color EL display apparatus having a first glass substrate with an initial thickness of 0.5 mm as the main substrate 33 and a color EL display apparatus having a second glass substrate with an initial thickness of 0.7 mm as the main substrate 33 were produced by the above-described method. The warp of the main substrate 33 was greater in the case where the first glass substrate was used as the main substrate 33 than in the case where the second glass substrate was used as the main substrate 33. In the case where the first glass substrate was used as the main substrate 33, it was difficult to bond the sealing substrate 52 and the main substrate 33 because the warp of the main substrate 33 was great. However, in the case where the second glass substrate was used as the main substrate 33, the warp of the main substrate 33 was small and it was possible to bond the sealing substrate 52 and the main substrate 33. Therefore, it is found that in order to suppress the warp of the main substrate 33 due to the internal stress existing inside the EL device portion 34, it is necessary that the initial thickness WD of the main substrate 33 be not less than 0.7 mm.

For this reason, it is desirable that the initial thickness WD of the main substrate 33 be not less than 0.7 mm. From the viewpoint of suppression of the warp of the main substrate 33, there is no specific upper limit to the initial thickness WD of the main substrate 33. However, considering the easiness of handling of the main substrate 33, it is preferable that the initial thickness WD of the main substrate 33 be as small as possible. Therefore, it is most desirable that the initial thickness WD of the main substrate 33 be not less than 0.7 mm and as close to 0.7 mm as possible.

In the manufacturing process of this embodiment, after the formation of the EL device portion 34, the main substrate 33 is processed to a thickness of less than 0.1 mm. The sealing substrate 52 is bonded to the main substrate 33 before the processing of the main substrate 33, and suppresses the warp of the main substrate 33 after the processing of the main substrate 33. For this reason, the main substrate 33 does not warp when the main substrate 33 is 0.7 mm in thickness after the processing. Since the concave portion 67 is formed in the sealing substrate 52 to create a gap to be filled with the protective material liquid, it is necessary to decide the thickness of the sealing substrate 52 in consideration of the concave portion 67 in addition to the material of the sealing substrate 52. As mentioned in the above-described manufacturing method, in the case where the sealing substrate 52 is realized by a glass substrate, considering the glass strength, it is desirable that the thickness WA of the sealing substrate 52 be not less than 0.8 mm. From the viewpoint of suppression of the warp of the main substrate 33, there is no specific upper limit to the thickness WA of the sealing substrate 52. However, considering the easiness of handling, it is preferable that the initial thickness WD of the main substrate 33 be as small as possible. Therefore, it is most desirable that the thickness WA of the sealing substrate 52 be not less than 0.8 mm and as close to 0.8 mm as possible.

The thickness WB of the reinforcing substrate 37 will hereinafter be described. The above-described color EL display apparatus 34 is frequently formed into a unit. For this reason, for example, a driving IC is further attached to the color EL display apparatus 34 and the color EL display apparatus 31 is fixed to a frame for display. The reinforcing substrate 37 is indispensable, for example, when the tab of the driving IC is connected to the terminals of the lower and the upper electrodes 41 and 45 and when the color EL display apparatus 31 is fixed to the frame in the process of forming the EL display apparatus 34 into a unit. In the case where the reinforcing substrate 37 is realized by a glass substrate, it is desirable that the thickness WB of the reinforcing substrate 37 be not less than 0.5 mm in order to facilitate the handling of the color EL display apparatus 31 when performing the above-mentioned connection and fixing. From the viewpoint of facilitation of the handling, there is no specific upper limit to the thickness WB of the reinforcing substrate 37. However, from a practical point of view, it is preferable that the thickness WB of the reinforcing substrate 52 be as thin as possible. Therefore, it is desirable that the thickness WB of the reinforcing substrate 37 be not less than 0.5 mm and as close to 0.5 mm as possible.

The color EL display apparatus 31 manufactured by the above-described method has a seal life and a mechanical strength sufficient for practical use and has a viewing angle wide enough for practical use compared to prior art color EL display apparatuses. Further, the legibility of the color EL display apparatus 31 is high compared to those of prior art color EL display apparatuses. From these, the color EL display apparatus 31 can be used as display devices for various uses.

Moreover, the structure of the inactivation protecting means of the thin-film EL devices 63, that is, the sealing portion 36 is substantially the same as the structure of the sealing portion used for the currently-used EL display apparatuses described in the prior art. Therefore, the color EL display apparatus 31 can obtain a seal life sufficient for practical use and can ensure a long-term reliability sufficient for practical use. Further, between the thin-film EL devices 63 and the color filters 47 to 49, the main substrate 33 is interposed and the protective material layer 53 is not interposed. Consequently, blur and distortion due to silica gel in the protective material layer 53 can be prevented from being caused in images displayed on the display screen of the color EL display apparatus 31.

From these, by using the above-described manufacturing method, the color EL display apparatus 31 capable of ensuring a long-term reliability sufficient for practical use and maintaining more excellent display quality than prior art color EL display apparatuses can easily be manufactured. The above-described manufacturing method can also be used for the manufacture of a color EL display apparatus employing organic EL devices which deteriorate due to moisture, and in this case, the above-mentioned effects can also be obtained.

Figure 4:
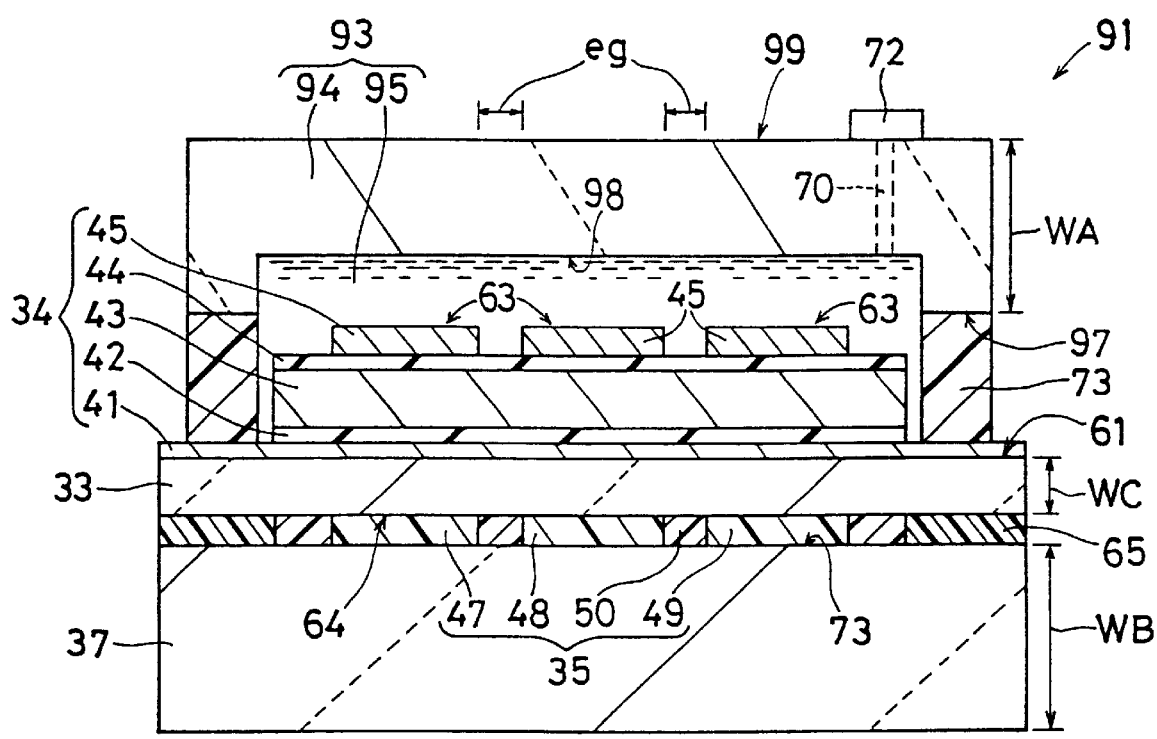
FIG. 4 is a cross-sectional view of a color EL display apparatus 91 manufactured by a color EL display apparatus manufacturing method according to a second embodiment of the invention.
Figure 5:
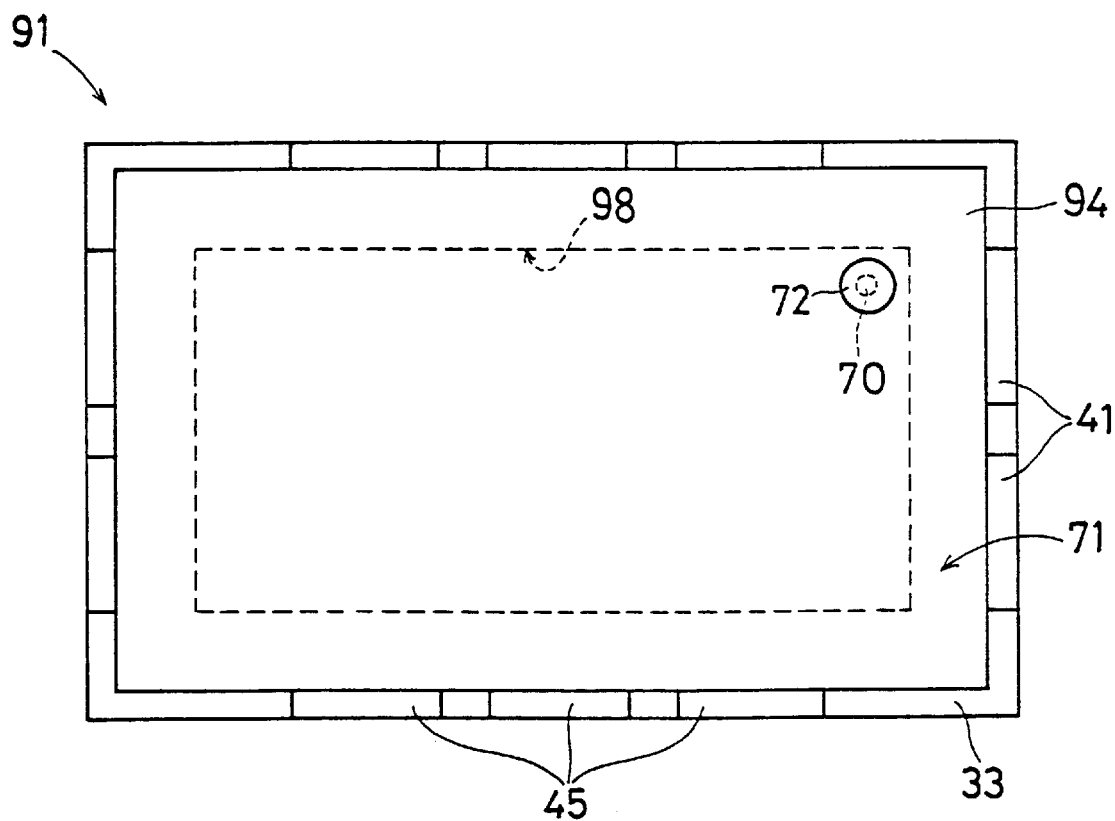
FIG. 5 is a plan view of the color EL display apparatus 91.

FIG. 4 is a cross-sectional view of a color EL display apparatus 91 manufactured by a color EL display apparatus manufacturing method according to a second embodiment of the invention. FIG. 5 is a plan view of the color EL display apparatus 91. FIGS. 4 and 5 will be described together. The color EL display apparatus 91 of the second embodiment is the same as the color EL display apparatus 31 of the first embodiment except the subsequently-described points associated with the sealing portion. Therefore, parts whose structures and operations are the same as those of parts of the color EL display apparatus 31 are denoted by the same reference numerals. Of the descriptions of the color EL display apparatus 91, the same descriptions as those of the first embodiment are omitted.

The color EL display apparatus 91 comprises the main substrate 33, the EL device portion 34, the color filter portion 35, a sealing portion 93 and the reinforcing substrate 37. The sealing portion 93 comprises a sealing substrate 94 and a protective material layer 95. The initial thickness WD of the main substrate 33, the reference thickness WC and the thickness WB of the reinforcing substrate 37 are decided based on the idea described in the first embodiment.

One surface 97 of the sealing substrate 94 and the one surface 61 of the main substrate 33 are opposed, and the sealing substrate 94 is fixed to the main substrate 33 by the adhesive layer 73. In the one surface 97 of the sealing substrate 94, a concave portion 98 is formed. The inner configuration of the concave portion 98 is a substantially rectangular parallelepiped. The sealing substrate 94 has the filling hole 70 communicating with the inner space of the concave portion 98. The filling hole 70 is closed by the sealing member 72 from the other surface 99 of the sealing substrate 94. The thickness WA of the sealing substrate 94 is decided based on the same idea as that of the sealing substrate 52 of the first embodiment. It is desirable that the thickness WA be not less than 0.8 mm.

The protective material layer 95 is formed by filling a protective material into the gap between the sealing substrate 94 and the main substrate 33, that is, the inner space of the concave portion 98. The protective material is realized, for example, by a mixture of silica gel and silicone oil. The EL device portion 34 is placed in the gap. Consequently, the protective material covers the surface of the EL device portion 34. The ends of the lower electrodes 41 and the ends of the upper electrodes 45 are exposed out of the sealing portion 93 as the terminals of the lower and the upper electrodes 41 and 45.

The method of manufacturing the color EL display apparatus 91 will hereinafter be described. Of the descriptions of steps of the method of manufacturing the color EL display apparatus 91 according to the second embodiment, the descriptions of the same steps as those of the method of manufacturing the color EL display apparatus 31 according to the first embodiment are omitted.

The main substrate 33 is realized by a glass substrate such as OA-2 (manufactured by Nippon Electric Glass Co., Ltd.). The initial width WD of the main substrate 33 is larger than the reference width WC. First, the EL device portion 34 is formed on the one surface 61 of the main substrate 33. The step of forming the EL device portion 34 is the same as the step of forming the EL device portion 34 in the method of manufacturing the color EL display apparatus 31 according to the first embodiment.

In parallel with the above-described formation of the EL device portion 34 or following the formation, digging processing using a grindstone or a sandblast is performed on the one surface 97 of the sealing substrate 94. Consequently, the concave portion 98 is formed in the one surface 97 of the sealing substrate 94. The sealing substrate 94 is made of, for example, glass. The thickness WA of the sealing substrate 94 is, for example, 1.1 mm. The depth of the concave portion 98 is, for example, 0.4 mm. The periphery of the one surface 97 of the sealing substrate 94 is left after the digging processing as a bonding frame for bonding the sealing substrate 94 to the main substrate 33. Then, the filling hole 70 is formed in the sealing substrate 94.

Then, with the one surface 61 of the main substrate 33 and the one surface 97 of the sealing substrate 94 being opposed to each other, the one surface 61 of the main substrate 33 and the periphery of the one surface 97 of the sealing substrate 94 are bonded by an adhesive. The adhesive which is realized, for example, by epoxy resin becomes the adhesive layer 73 after being hardened. The terminals of the lower electrodes 41 and the terminals of the upper electrodes 45 are not opposed to the sealing substrate 94 but are exposed.

After the bonding of the substrates 33 and 94, the protective material liquid is filled into the gap between the main substrate 33 and the sealing substrate 94, that is, the inner space of the concave portion 98 through the filling hole 70. The step of filling the protective material liquid is the same as the protective material liquid filling step of the method of manufacturing the color EL display apparatus 31 according to the first embodiment. The weight percentage of silica gel in the protective material liquid is 30 wt %. After the gap is filled with the protective material liquid, the filling hole 70 is closed by the sealing member 72. By the process from the processing of the sealing substrate 94 to the closing of the filling hole 70, the sealing portion 93 is completed.

Then, the portion within the outer surface of the main substrate 33 other than the other surface 64, and the outer surface of the sealing portion 36 are covered with rubber or the like. The portion is, for example, the portion within the one surface 61 of the main substrate 33 where the terminals of the lower and the upper electrodes 41 and 45 are formed. Then, the other surface 64 of the main substrate 33 is stepwisely ground by a glass grinder until the thickness of the main substrate 33 becomes the reference thickness WC. The reference thickness WC is, for example, 75 $\mu$m.

In parallel with the above-described formation of the EL device portion 34 and the sealing portion 93 or following the formation, the color filter portion 35 is formed on one surface of the reinforcing substrate 37. The step of forming the color filter portion 35 is the same as the step of forming the color filter portion 35 in the method of manufacturing the color EL display apparatus 31 according to the first embodiment except that the surface where the color filter portion 35 is formed is changed from the other surface 64 of the main substrate 33 to the one surface 73 of the reinforcing substrate 37.

Lastly, the reinforcing substrate 37 is bonded to the other surface 64 of the main substrate 33, for example, by use of a fluid photobond. In this case, the one surface 73 of the reinforcing substrate 37 and the other surface 64 of the main substrate 33 are opposed to each other and the color filter portion 35 is interposed therebetween. The photobond becomes the adhesive layer 65 after being hardened. By the above-described process, the color EL display apparatus 91 is completed.

The main substrate 33 and the sealing substrate 94 can be processed by grinding as well as chemical etching described in the first embodiment. The color EL display apparatus 91 manufactured by the above-described method has a seal life and a mechanical strength sufficient for practical use and has a viewing angle wide enough for practical use compared to prior art color EL display apparatuses. Further, by the provision of the light intercepting filter 50, the contrast of the color EL display apparatus 91 is superior to that of a color EL display apparatus having no light intercepting filter, and the legibility is improved. Therefore, the legibility of the color EL display apparatus 91 is higher than those of prior art color EL display apparatuses. From these, the color EL display apparatus 91 can be used as display devices for various uses. Moreover, by using the above-described manufacturing method, the color EL display apparatus 91 capable of ensuring a long-term reliability sufficient for practical use and maintaining more excellent display quality than prior art color EL display apparatuses can easily be manufactured.

Figure 6:
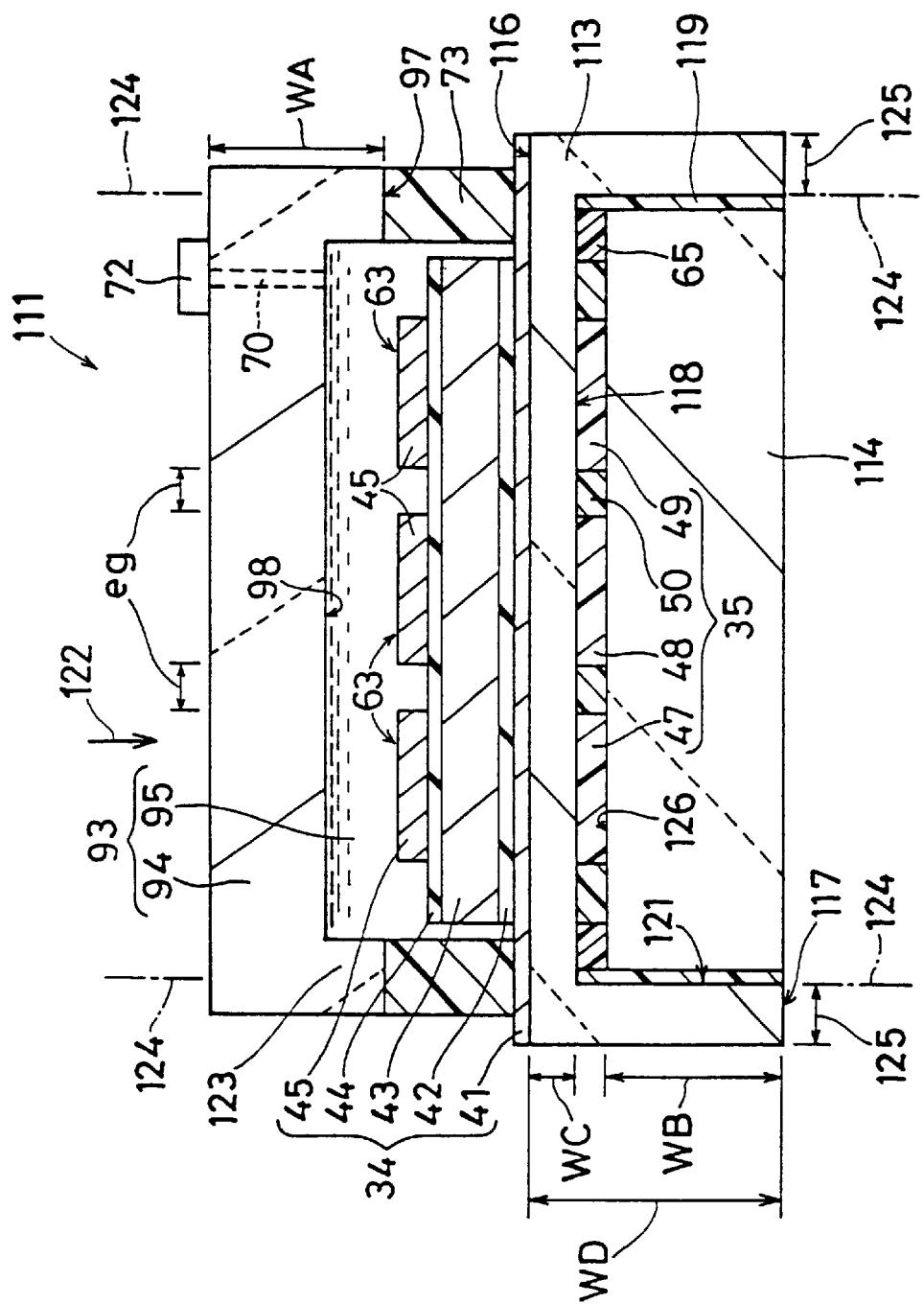
FIG. 6 is a cross-sectional view of a color EL display apparatus 111 manufactured by a color EL display apparatus manufacturing method according to a third embodiment of the invention.
Figure 7:
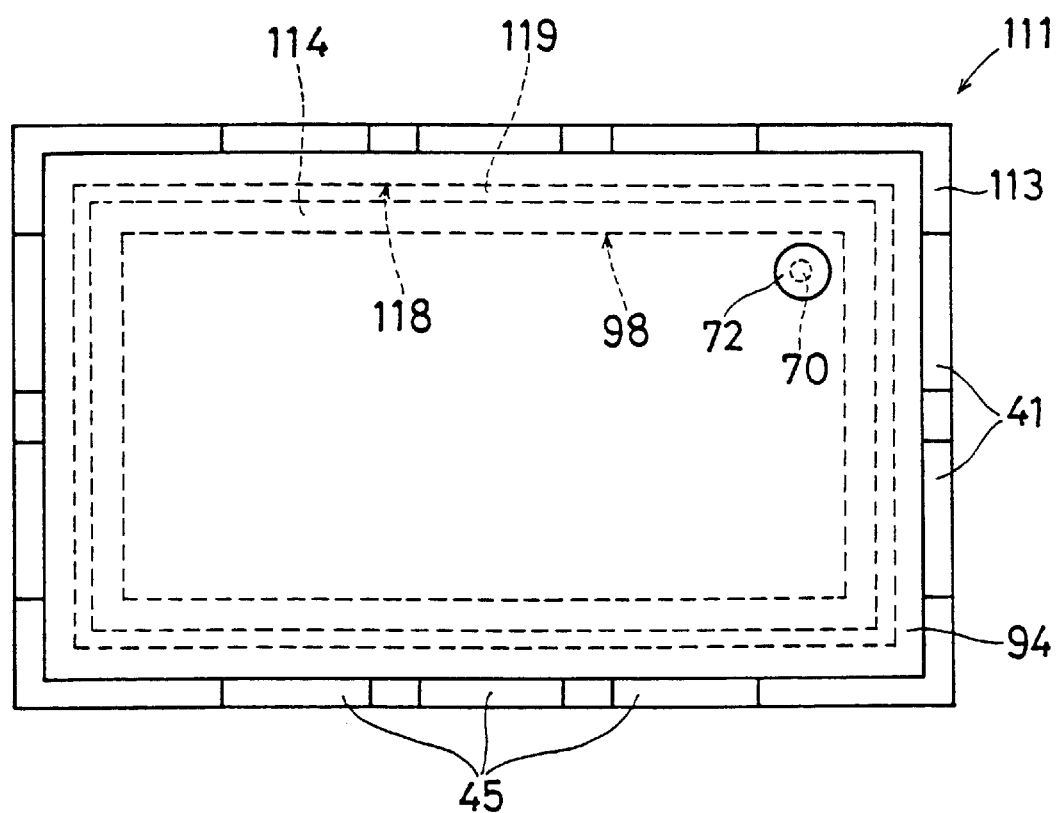
FIG. 7 is a plan view of the color EL display apparatus 111.

FIG. 6 is a cross-sectional view of a color EL display apparatus 111 manufactured by a color EL display apparatus manufacturing method according to a third embodiment of the invention. FIG. 7 is a plan view of the color EL display apparatus 111. FIGS. 6 and 7 will be described together. The color EL display apparatus 111 of the third embodiment is the same as the color EL display apparatus 91 of the second embodiment except the subsequently-described points associated with the main substrate and the reinforcing substrate. Therefore, parts whose structures and operations are the same as those of parts of the color EL display apparatuses 31 and 91 are denoted by the same reference numerals. Of the descriptions of the color EL display apparatus 111, the same descriptions as those of the first embodiment are omitted.

The color EL display apparatus 111 comprises a main substrate 113, the EL device portion 34, the color filter portion 35, the sealing portion 93 and a reinforcing substrate 114. The EL device portion 34 is disposed on one surface 116 of the main substrate 113. In the other surface 117 of the main substrate 113, a concave portion 118 is formed. The inner configuration of the concave portion 118 is a substantially rectangular parallelepiped. The distance between the bottom surface of the concave portion 118 and the one surface 116 of the main substrate 113 is the reference thickness WC. The periphery of the main substrate 113 is held at the initial thickness WD of the main substrate 113 and is thicker than the reference thickness WD. The color filter portion 35 is disposed on the bottom surface of the concave portion 118.

The reinforcing substrate 114 which is smaller than the inner space of the concave portion 118 of the main substrate 33 can be placed in the concave portion 118. The reinforcing substrate 114 is fixed to the bottom surface of the concave portion 118 of the main substrate 113 by the adhesive layer 65. A resin layer 119 is interposed between an inner peripheral surface 121 of the concave portion 118 and the side surfaces of the reinforcing substrate 114. Viewed from the direction of the normal 122 to the one surface 116 of the main substrate 113, the inner peripheral surface 121 of the concave portion 118 substantially coincides with the center 124 of a periphery 123 of the sealing substrate 95, that is, the center of the bonding frame of the sealing substrate 94. The initial thickness WD of the main substrate 113, the reference thickness WC of the main substrate 113 and the thickness WB of the reinforcing substrate 114 are decided based on the idea the same as the initial thickness WD of the main substrate 33, the reference thickness WC of the main substrate 33 and the thickness WB of the reinforcing substrate 37 of the first embodiment.

The method of manufacturing the color EL display apparatus 111 will hereinafter be described. Of the descriptions of steps of the method of manufacturing the color EL display apparatus 111 according to the third embodiment, the descriptions of the same steps as those of the method of manufacturing the color EL display apparatuses 31 and 91 according to the first and the second embodiments are omitted.

The main substrate 113 is realized by a glass substrate such as OA-2 (manufactured by Nippon Electric Glass Co., Ltd.) The initial width WD of the main substrate 113 is larger than the reference thickness WC. First, the EL device portion 34 is formed on the one surface 116 of the main substrate 113. The step of forming the EL device portion 34 is the same as the step of forming the EL device portion 34 in the method of manufacturing the color EL display apparatus 31 according to the first embodiment.

In parallel with the above-described formation of the thin-film EL devices or following the formation, the one surface 97 of the sealing substrate 94 is etched by use of hydrofluoric acid. Consequently, the concave portion 98 is formed in the one surface 97 of the sealing substrate 94. The sealing substrate is made of, for example, glass. The thickness WA of the sealing substrate 94 is, for example, 1.1 mm. The depth of the concave portion 98 is, for example, 0.4 mm. The periphery 123 of the one surface 97 of the sealing substrate 94 is left after the digging processing as a bonding frame for bonding the sealing substrate 94 to the main substrate 113. Then, the filling hole 70 is formed in the sealing substrate 94.

Then, with the one surface 116 of the main substrate 113 and the one surface 97 of the sealing substrate 94 being opposed to each other, the one surface 116 of the main substrate 113 and the periphery of the one surface 97 of the sealing substrate 94 are bonded by use of an adhesive. The adhesive which is realized, for example, by epoxy resin becomes the adhesive layer 73 after being hardened. In this case, for example, the terminals of the lower electrodes 41 and the terminals of the upper electrodes 45 are not opposed to the sealing substrate 94 but are exposed.

After the bonding of the substrates 113 and 94, the protective material liquid is filled into the gap between the main substrate 113 and the sealing substrate 94, that is, the inner space of the concave portion 98 through the filling hole 70. The step of filling the protective material liquid is the same as the protective material liquid filling step of the method of manufacturing the color EL display apparatus 31 according to the first embodiment. The weight percentage of silica gel in the protective material liquid is 25 wt %. After the gap is filled with the protective material liquid, the filling hole 70 is closed by the sealing member 72. By the process from the processing of the sealing substrate 94 to the closing of the filling hole 70, the sealing portion 93 is completed.

Then, the outer surface of the sealing portion 93, the portion within the one surface 116 of the main substrate 113 where the terminals of the lower and the upper electrodes 41 and 45 are formed, and a periphery 125 of the other surface 117 of the main substrate 113 are covered with an etching-resistant resist, a PET film or the like. The periphery 125 of the other surface 117 of the main substrate 113 is, for example, a frame-shaped portion within the other surface 117 from the end of the other surface 117 to the portion coinciding with the center 124 of the periphery of the sealing substrate 94 when viewed from the direction of the normal 122. Then, the other surface 117 of the main substrate 113 is etched by a wet etching method using an etchant whose main component is hydrofluoric acid. Consequently, the concave portion 118 is formed in the other surface 117 of the main substrate 113. The distance between the bottom surface of the concave portion 118 of the main substrate 113 and the one surface 116 of the main substrate 113 is the reference thickness WC. The reference thickness WC is, for example, 75 μm. The peripheral portion 125 of the other surface 117 of the main substrate 113 is left in the frame shape after the digging processing.

In parallel with the above-described formation of the sealing portion 93 and the processing of the main substrate 113 or following the formation and the processing, the color filter portion 35 is formed on one surface 126 of the reinforcing substrate 114. The step of forming the color filter portion 35 is the same as the step of forming the color filter portion 35 in the method of manufacturing the color EL display apparatus 91 according to the second embodiment except that the reinforcing substrate 37 is replaced by the reinforcing substrate 114.

Then, the reinforcing substrate 114 is bonded to the bottom surface of the concave portion 118 of the main substrate 113, for example, by use of a fluid photobond. In this case, the one surface 126 of the reinforcing substrate 114 and the bottom surface of the concave portion 118 of the main substrate 33 are opposed to each other and the color filter portion 35 is interposed therebetween. The photobond becomes the adhesive layer 65 after being hardened. Lastly, for example, epoxy resin is filled into the gap between the inner peripheral surface 121 of the concave portion 118 of the main substrate 113 and the side surfaces of the reinforcing substrate 114 in order to reinforce the main substrate 113. The epoxy resin becomes the resin layer 119 after being hardened. By the above-described process, the color EL display apparatus 111 is completed.

The color EL display apparatus 111 manufactured by the above-described method has a seal life and a mechanical strength sufficient for practical use and has a viewing angle wide enough for practical use compared to prior art color EL display apparatuses. Further, by the provision of the light intercepting filter 50, the contrast of the color EL display apparatus 111 is superior to that of a color EL display apparatus having no light intercepting filter, and the legibility is improved. Therefore, the legibility of the color EL display apparatus 111 is higher than those of prior art color EL display apparatuses. From these, the color EL display apparatus 111 can be used as display devices for various uses. Moreover, by using the above-described manufacturing method, the color EL display apparatus 111 capable of ensuring a long-term reliability sufficient for practical use and maintaining more excellent display quality than prior art color EL display apparatuses can easily be manufactured.

Further, the reinforcing substrate 114 is bonded to the periphery within the main substrate 113, that is, the thick portion of the main substrate 113 by the resin layer 119. For this reason, the mechanical strength of the color EL display apparatus 111 is greater than those of the color EL display apparatuses 31 and 91 of the first and the second embodiments. When the color EL display apparatus 111 of the third embodiment is formed into a unit, the tab of the driving IC can directly be connected to the terminals of the upper and the lower electrodes 45 and 41 on the main substrate 113. In the above-mentioned case, further, the color EL display apparatus 111 can directly be fixed to the frame for display. Consequently, it is facilitated to form the color EL display apparatus 111 into a unit.

Figure 8:
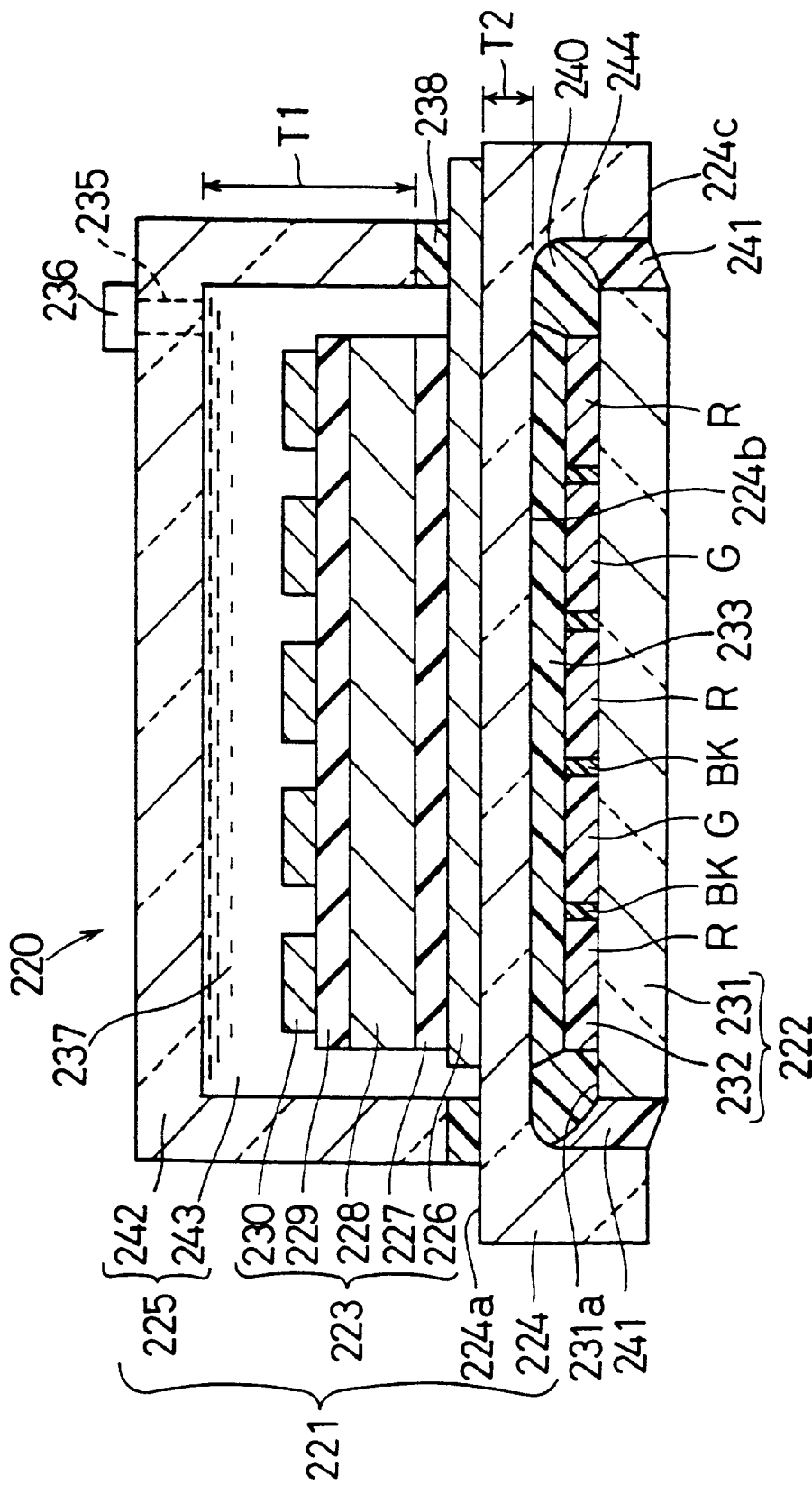
FIG. 8 is a cross-sectional view showing a color EL display apparatus 220 manufactured by a color EL display apparatus manufacturing method according to a fourth embodiment of the invention.

FIG. 8 is a cross-sectional view showing a color EL display apparatus 220 manufactured by a color EL display apparatus manufacturing method according to a fourth embodiment of the invention. The color EL display apparatus 220 comprises an EL device 221 and a color filter substrate 222 bonded together. The EL device 221 comprises a light-transmitting EL-device substrate 224, an EL device portion 223 and a sealing portion 225. The color filter substrate 222 comprises a light-transmitting substrate 231 and a color filter 232.

The EL device 221 is a double-insulation-type thin-film EL device in which a first electrode 226, a first insulation film 227, a light emission layer 228, a second insulation film 229 and a second electrode 230 constituting the EL device portion 223 are successively laminated on the EL-device substrate 224 made of glass. To form the first electrode 226, ITO (indium-tin oxide) is deposited on one surface 224a of the EL-device substrate 224 in a thickness of approximately 100 nm by the electron beam vapor deposition method or the high-frequency sputtering method, and the first electrode 26 is formed in stripes by wet etching using a photoresist.

The first insulation film 227 laminated on the first electrode 226 comprises a lamination of an $SiO_2$ film with a thickness of approximately 40 nm and an $Si_3N_4$ film with a thickness of approximately 220 nm, and is formed by the high-frequency sputtering method. As the light emission layer 228 laminated on the first insulation film 227, a ZnS:Mn layer is formed in a thickness of approximately 7000 Å by the electron beam vapor deposition method using Zn:Mn as the evaporation source. The EL light emission layer 228 emits yellow light including red to green light emission ranges by applying an alternating field between the first and the second electrodes 226 and 230, and by dividing the light into spectra by red and green color filters, a multicolor EL display apparatus of red and green can be produced. The reason why such a light emission layer 228 is used in this embodiment is that a monochrome EL display apparatus using such a light emission layer has already been put to practical use and it has been confirmed that the material of the light emission layer is excellent in light emission brightness and light emission stability. The color EL display apparatus embodying the invention is not limited to such a multicolor EL display apparatus of red and green, but a full-color EL display apparatus can be produced, for example, by dividing into spectra white EL light emitted from a lamination of ZnS:Mn and SrS:Ce light emission layers by color filters of red, green and blue.

The second insulation film 229 laminated on the light emission layer 228 comprises, for example, a lamination of an $Si_3N_4$ film with a thickness of approximately 100 nm and an $SiO_2$ film with a thickness of approximately 35 nm. These films are formed by the high-frequency sputtering method. After the formation of the second insulation film 229, high vacuum annealing is performed in order to improve the crystallinity of the light emission layer 228. The high vacuum annealing is performed at 630° C. in a high vacuum of not more than $1 \times 10^{-4}$ Pa.

Lastly, as the second electrode 230, Al is deposited in a thickness of approximately 500 nm by heat vapor deposition, and the second electrode 230 is formed in stripes perpendicular to the first electrode 226 by wet etching using a photoresist, so that the EL device portion 223 is completed.

To form the moistureproof sealing portion 225 of the EL device 221, a protective glass 242 where digging processing is performed to a depth T1 of approximately 1 mm is disposed so that the EL device portion 223 is sealed in the portion where the digging processing is performed, and the periphery of the protective glass 242 is bonded onto the one surface 224a of the EL-device substrate 224 by use of an epoxy resin 238. Then, silicone oil mixed with silica gel is filled into a sealed space 237 where the EL device portion 223 is sealed through an oil introduction hole 235 formed in the protective glass 242 in advance, and the introduction hole is closed by a sealing glass 236. In the case where silicone oil is filled, under a condition where the sealed space 237 is evacuated by exhausting air in the sealed space 237 through the oil introduction hole 235, silicone oil is absorbed through the oil introduction hole 235 so that the sealed space 237 is filled with silicone oil. Thus, since it is necessary that the sealed space 237 be evacuated when oil is filled, the EL-device substrate 224 has a thickness that endures such a vacuum when oil is filled.

After the EL device portion 223 and the moistureproof sealing portion 225 are formed on the EL-device substrate 224, by etching using hydrofluoric acid, a concave portion 244 is formed in the EL-device substrate 224 on the side opposite to the side where the EL device portion 223 is provided so that the thickness T2 of the portion of the EL-device substrate 224 opposed to the EL device portion 223 is approximately 100 $\mu$m. At this time, in view of the mounting of the color filter substrate 222, only the portion where the color filter substrate 222 is fitted is etched into a concave so that the periphery of the EL-device substrate 224 is left in a frame shape. By thus forming the concave portion 244 in the EL-device substrate 224, the EL device 221 and the color filter substrate 222 are bonded together with the color filter substrate 222 being fitted in the concave portion of the EL-device substrate 224, so that the bonding strength increases. As a result, the color EL display apparatus 220 has a sufficient mechanical strength. Moreover, since the EL-device substrate 224 interposed between the EL device portion 223 and the color filter 232 is thinned by etching, the distance between the first electrode 226 of the EL device portion 223 and the color filter 232 decreases. Consequently, the viewing angle deterioration due to color displacements can be prevented, so that a large viewing angle can be ensured.

The methods of mounting the color filter 232 include the following: a method in which the color filter 232 is directly formed on the other surface 224b which is the bottom surface of the concave portion 244 of the EL-device substrate 224, and the substrate 231 is bonded thereonto; and a method in which the substrate 231 where the color filter 232 is formed is bonded to the other surface 224b of the EL-device substrate 224. According to the latter method, since an adhesive layer is interposed between the color filter 232 and the EL-device substrate 224, the thickness of the adhesive layer affects the viewing angle. According to the former method, it is necessary to directly form the color filter 232 on the other surface 224b of the EL-device substrate 224 which is the bottom surface of the concave portion 244, and the production of the color filter 232 is difficult. Therefore, this embodiment employs the latter method where the production of the color filter 232 is easier.

The color filter 232 of the color filter substrate 222 comprises red and green filters R and G alternately arranged on one surface 231a of a light-transmitting glass substrate. Black filters Bk are formed between the filters R and G. The color filter substrate 222 and the EL-device substrate 224 of the EL device 221 are bonded together by filling a thermosetting synthetic resin 233 into the gap between the color filter 232 side surface of the color filter substrate 222, that is, the surfaces of the filters R, G and BK opposed to the other surface 224b of the EL-device substrate 224 and the one surface 231a of the substrate 231, and the other surface 224b of the EL-device substrate 224. The one surface 231a of the substrate 231 where the color filter 232 is not disposed and the EL-device substrate 224 are fixed at not less than two points (at both ends of the substrate 231 in FIG. 8) by a photo-setting resin 240. The gap between the color filter substrate 222 and the EL-device substrate 224 is filled with a silicone resin 241. Thus, the color filter substrate 222 and the EL device 221 are bonded together with a great strength.

Figure 9:
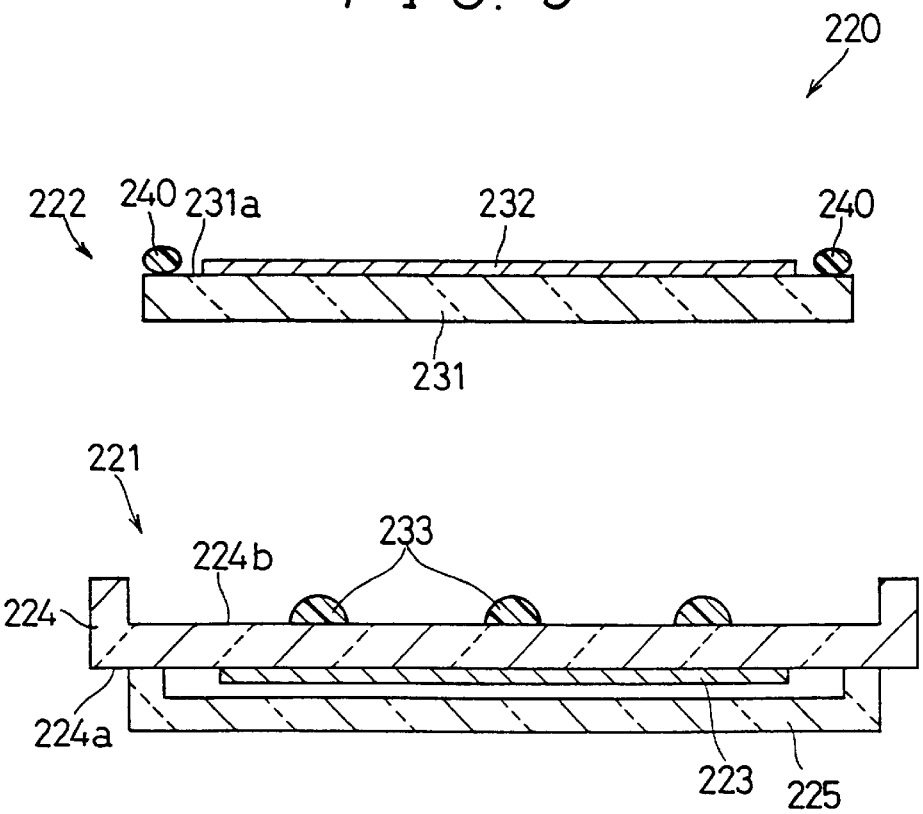
FIG. 9 is a cross-sectional view showing a color filter substrate 222 and an EL-device substrate 221.

Subsequently, the general outline of the method of bonding the EL device 221 and the color filter substrate 222 will be shown. First, as shown in FIG. 9, the color filter substrate 222 and the EL device 221 are prepared, and onto the other surface 224b of the EL-device substrate 224 of the EL device 221, a thermosetting resin 233 such as FA Sealer 1017C (product name) is dropped so as to convexly bulge in a conical shape having one convex portion as shown in FIG. 9. The thermosetting resin 233 has no bubbles mixed therein, and has a viscosity of a degree such that the thermosetting resin does not thinly spread but convexly bulges when dropped as mentioned above. To satisfy this condition, the thermosetting resin 233 of this embodiment has a viscosity of approximately 1500 to 3000 cps at an ordinary temperature of 25° C. On the color filter substrate 222, the photo-setting resin 240 is placed on at least two points of the portion of the one surface 231a of the substrate 231 where the color filter 232 is not disposed.

Figure 10:
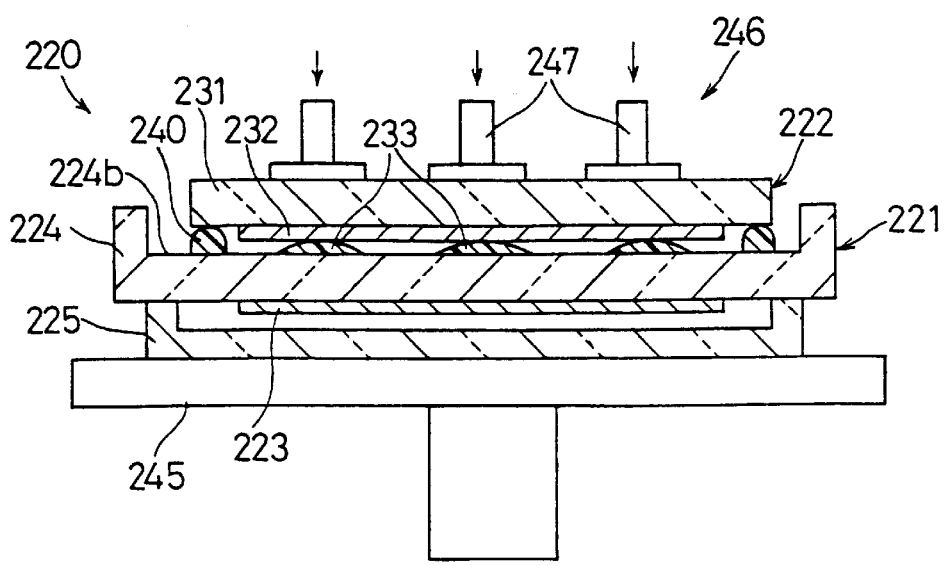
FIG. 10 is a cross-sectional view showing a condition in which the color filter substrate 222 and the EL-device substrate 224 are bonded together.

Then, as shown in FIG. 10, the EL device 221 and the color filter substrate 222 are brought into intimate contact with each other by an intimate contact jig 246. The intimate contact jig 246 having an EL substrate support 245 and a pressing member 247 first places the EL device 221 on the EL substrate support 245 so that the other surface 224b of the EL-device substrate 224 faces upward, then, places the color filter substrate 222 on the EL device 221 so that the color filter 232 of the color filter substrate 222 is opposed to the other surface 224b of the EL-device substrate 224, and then, presses the color filter substrate 222 by the pressing member 247 from the surface opposite to the side where the color filter 232 is disposed, thereby bringing the color filter substrate and the EL-device substrate 224 into intimate contact with each other. Consequently, the thermosetting resin 233 dropped so as to convexly bulge is radially spread, so that the thermosetting resin 233 is filled in the gap between the substrates.

In the case where the thermosetting resin 233 is dropped, in accordance with the rectangular EL-device substrate 224, as shown in FIG. 11A, the thermosetting resin 233 is dropped onto a plurality of points (three points in this embodiment) at regular intervals along the center line A1 passing through the center, in the direction of the width, of the EL-device substrate 224 and extending in the direction of the length. When the substrates 221 and 222 are opposed to each other and pressed in a direction that decreases the distance therebetween, the tops of the convex resin portions come into contact with the opposed substrate without fail, so that the convex resin portions are radially spread with the tops as the centers. Consequently, the resin is filled in the entire gap between the substrates. In the case where the thermosetting resin 233 is dropped not along a straight line but dropped along two parallel lines as shown in FIG. 11B, when the portions of resin dropped onto four adjacent points forming a square are spread, the resin is spread over the substrate surface with a gap being left at the center of the four points as shown in FIG. 11B and the air shut up in the gap has nowhere to escape, so that the air is left between the substrates as a bubble. On the contrary, in this embodiment, by dropping the thermosetting resin 233 along a straight line, no gap as shown in FIG. 11B is formed, so that the formation of bubbles is surely prevented.

After the substrates 221 and 222 are brought into intimate contact and the thermosetting resin 233 is filled into the gap therebetween, the color filter substrate 222 is positioned by aligning the electrode pattern of the first electrode 226 and the pattern of the color filter 232, and the photo-setting resin 240 is hardened by applying ultraviolet rays to the portion where the photo-setting resin 240 is placed, thereby temporarily fixing the color filter substrate 222 and the EL device 221. Since the photo-setting resin 240 is placed on the portion where the color filter 232 is not formed as mentioned previously, it never occurs that the ultraviolet rays are absorbed by the color filter; the photo-setting resin 240 can surely be hardened to temporarily fix the color filter substrate 222 and the EL device 221.

Then, the filled thermosetting resin 233 is hardened. When the adhesive layer of the thermosetting resin 233 is thick, the viewing angle of the color EL display apparatus 220 is affected. However, since the thermosetting resin (FA Sealer) 233 used in this embodiment has a high viscosity of approximately 1500 to 3000 cps at an ordinary temperature of 25° C., it is difficult to strongly spread the thermosetting resin 233 at the ordinary temperature.

The thermosetting resin 233 used in this embodiment decreases in viscosity by being heated. For example, at 100° C. which is a temperature immediately before the temperature at which the thermosetting resin 233 is thermally hardened, the viscosity is decreased to approximately 100 cps or lower, and the thermosetting resin 233 is thermally hardened at 110° C. Therefore, as shown in FIG. 12, the color EL display apparatus 220 is set on a jig capable of applying a force onto the color filter 232 formed portion of the color filter substrate 222, and the whole of the color EL display apparatus 220 is placed in an oven to thermally harden the thermosetting resin 233, whereby the thermosetting resin 233 can be hardened in a thinly spread condition. In this embodiment, in the jig that applies a force to the color filter 232 formed portion, under a condition where the color EL display apparatus 220 is placed on a support 251 with the EL device 221 side down, a weight 250 is placed on the color filter 232 formed portion of the color filter substrate 222 so that a pressure acts in a direction that decreases the distance between the substrates 222 and 224. Such a color EL display apparatus 220 is placed in an oven, and the oven is heated to 110° C. at which the thermosetting resin 233 is thermally hardened. The thermosetting resin 233 decreases in viscosity while being heated, and by the color filter formed portion being pressed by the weight 250, the resin 233 is thinly spread to fill the entire gap between the substrates. Thus, the resin 233 is thinly spread and is thermally hardened when the temperature of the thermosetting resin 233 reaches 110° C., so that the color filter substrate 222 and the EL device 221 are completely bonded. At this time, since the EL device 221 and the color filter substrate 222 are temporarily fixed in a positioned condition, the device 221 and the substrate 222 are prevented from being bonded in a displaced condition. The reason why the color filter 232 formed portion of the color filter substrate 222 is pressed is that since the portion bonded by the photo-setting resin 240 has already been hardened and the gap is maintained in the photo-setting resin portion even during heating, when the weight 350 is placed over two points of the photo-setting resin 340 having been hardened, no pressure acts on the central portion of the color filter substrate 322. Moreover, since a force is applied to spread the resin after the viscosity of the resin is decreased, a large force is unnecessary and the resin can easily be thinly spread.

Since the thermosetting resin 333 is thus hardened in a thinly and uniformly spread condition, the thickness of the resin layer is decreased, so that color displacements due to the viewing angle are not caused. Moreover, since the thermosetting resin can be filled into the gap between the substrates without any bubbles being formed, image quality degradation can also be prevented.

Lastly, the silicone resin 341 is filled into the gap between the color filter substrate 322 and the EL-device substrate 324 to complete the color EL display apparatus 320.

Figure 13:
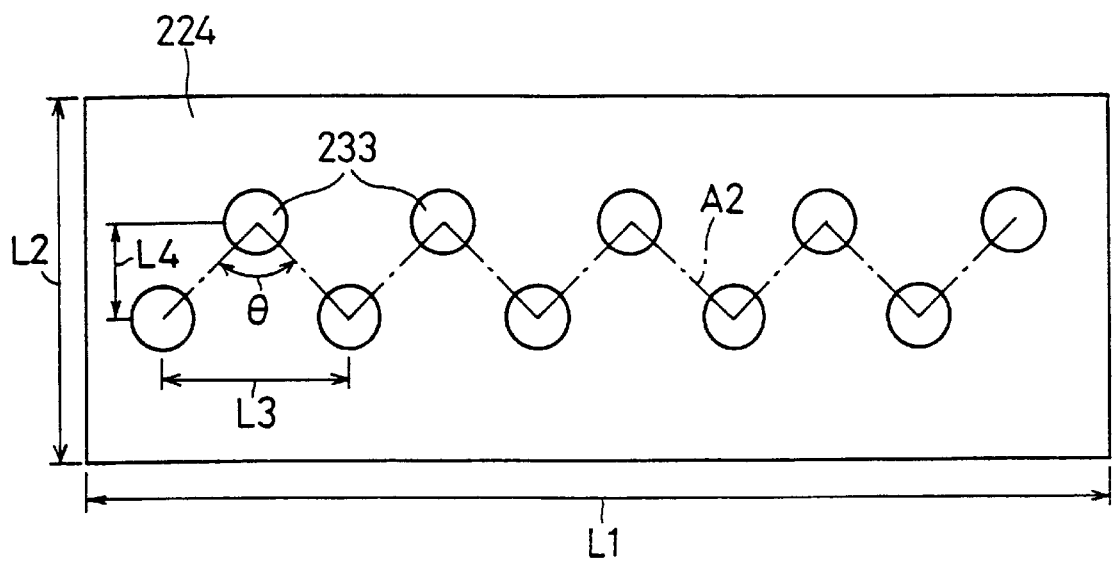
FIG. 13 is a plan view showing a condition in which a thermosetting resin 333 is dropped onto the EL-device substrate 224 in a color EL display apparatus manufacturing method according to a fifth embodiment of the invention.

FIG. 13 is a plan view showing dropped positions of a thermosetting resin 333 dropped onto an EL-device substrate 324 in a color EL display apparatus manufacturing method according to a fifth embodiment of the invention. Since this manufacturing method is the same as the method shown in FIG. 15 to FIGS. 19A and 19B except the dropped positions, descriptions of the method are omitted.

Figure 21:
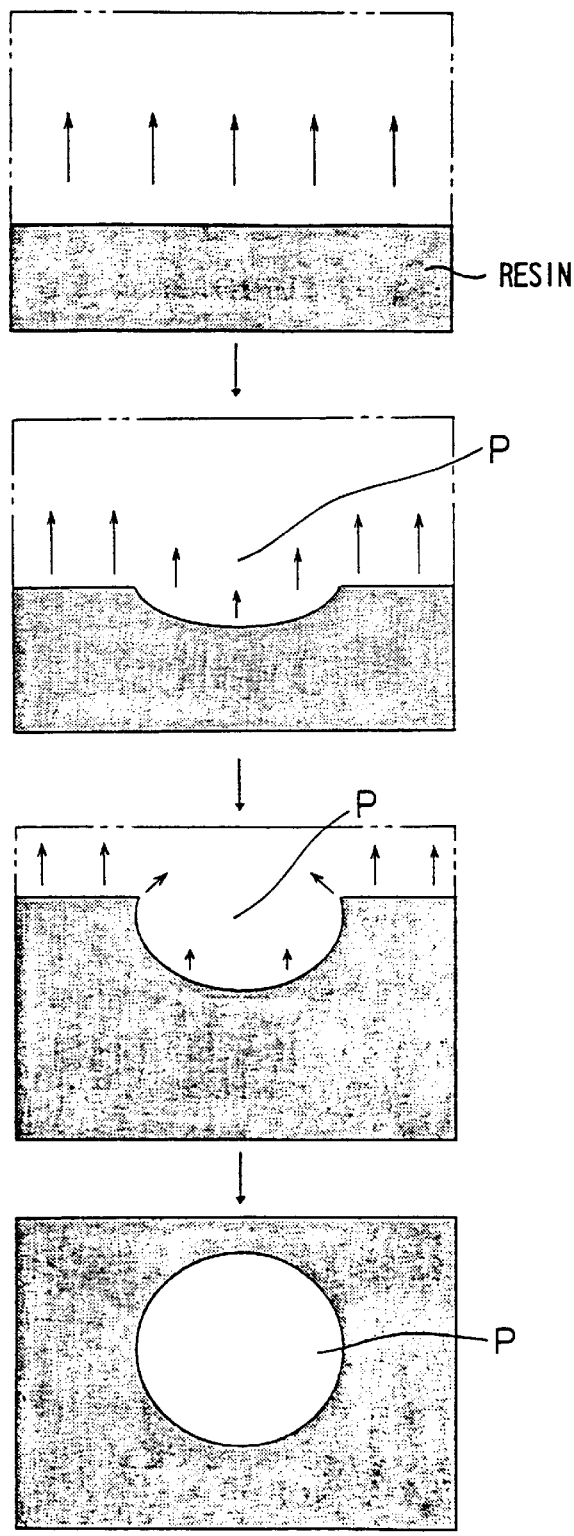
FIG. 21 is a view schematically showing the process of a bubble being formed in the local concave portion P.

With respect to the size of the EL-device substrate 324 used in this embodiment, the lateral size L1 is 26 cm and the longitudinal size L2 is 8 cm. On such a rectangular EL-device substrate 324, the thermosetting resin 333 is dropped at each vertex of a zigzag line A2 as shown in FIG. 21. The distance L3 between the dropped positions of the thermosetting resin 333 adjoining in a longitudinal direction is 4 cm, and the distance L4 in a lateral direction is 2 cm. The inside bend angle θ of the line A2 being bent in zigzags is selected so as to fall within a range of $90°<θ≦180°$. In the case where the bend angle θ is less than 90°, when the portions of the thermosetting resin 333 at three adjoining points are radially spread, a gap is formed at the center of the three points, which causes a bubble. Moreover, that the bend angle is 180° means that the line A2 is a straight line.

Thus, by dropping the thermosetting resin 333 along a zigzag line, even when the EL-device substrate 324 is rectangular, the thermosetting resin can uniformly be spread and filled in the entire gap between the substrates.

The positions where the thermosetting resin 333 is dropped are not limited to the vertices of the zigzag line A2 but the thermosetting resin may be dropped onto straight line portions. The line along which the thermosetting resin 333 is dropped is not limited to a zigzag line but the thermosetting resin may be dropped along a wavy line. In this case, the angle formed by the resin portions at consecutive three points is also selected so as to fall within a range of $90°<θ≦180°$, so that the resin can be filled in the gap between the substrates without any bubbles being formed.

Figure 14:
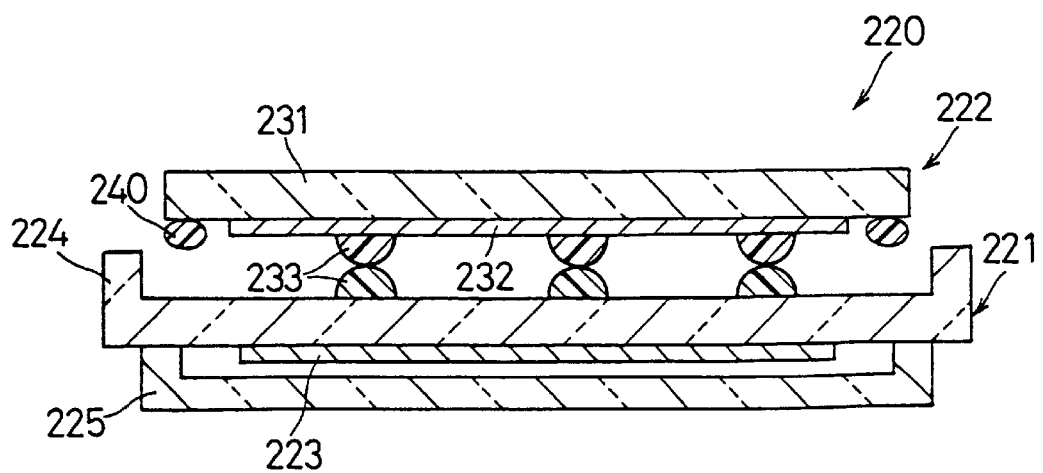
FIG. 14 is a cross-sectional view showing a condition in which the color filter substrate 222 and the EL-device substrate 224 are bonded together in a color EL display apparatus manufacturing method according to a sixth embodiment of the invention.

FIG. 14 is a cross-sectional view showing a condition in which the EL device 221 and the color filter substrate 222 are bonded together in a color EL display apparatus manufacturing method according to a sixth embodiment of the invention. The method of this embodiment is different from the color display apparatus manufacturing method shown in FIGS. 8 to 12 only in the bonding method. Therefore, descriptions of the same manufacturing steps are omitted.

In this embodiment, the thermosetting resin is dropped so as to be convexed not only onto three points on the EL-device substrate 224, but also onto three points on the color filter 232 of the color filter substrate 222. The thermosetting resin is dropped onto positions where when the substrates 222 and 224 are bonded together, the tops of the portions of the thermosetting resin 233 dropped so as to be convexed are in contact with each other. By thus bringing the substrates 222 and 224 into intimate contact so that the tops of the resin portions are in contact with each other, the resin is radially spread with the tops as the centers, and the resin can be filled in the gap between the substrates without any bubbles being formed. By thus bonding the substrates 222 and 224 so that a pair of resin portions are in contact with each other, the dropping amount per position can be reduced when the filling amount is the same, so that the thermosetting resin can suitably be dropped so as to be convexed without the dropped resin being spread. In this embodiment, the resin dropped positions are not limited to positions along a straight line; the resin may be dropped along a zigzag line on both the color filter substrate 222 and the EL-device substrate 224. In this case, the color filter substrate 222 and the EL-device substrate 224 are brought into intimate contact so that the tops of the portions of the dropped thermosetting resin are in contact with each other.

As yet another mode of the embodiment of the invention, for example, in a method of manufacturing a square color EL display apparatus, the display apparatus may be manufactured by dropping the thermosetting resin onto one point at the center of the EL-device substrate 224 and bringing the color filter substrate and the EL-device substrate into intimate contact. Further, the display apparatus may be manufactured by dropping the thermosetting resin onto the center of both of the filter substrate 222 and the EL-device substrate 224 and bringing the substrates 222 and 224 into intimate contact so that the tops of the resin portions are in contact with each other.

In the above-described embodiments, after the photosetting resin is placed on the color filter substrate 222, the substrates 222 and 224 are brought into intimate contact. However, as still another mode of the embodiment of the invention, the display apparatus may be manufactured by filling the photo-setting resin 240 into the gap between the EL-device substrate 224 and the color filter substrate 222 after the substrates 222 and 224 are brought into intimate contact with each other, and hardening the resin by applying ultraviolet rays. In the above-described embodiments, the number of drops of the thermosetting resin for each position is not limited to one but several drops of resin may be applied to one position so as to convexly bulge. Thereby, the resin filling amount can be increased.

Figure 15:
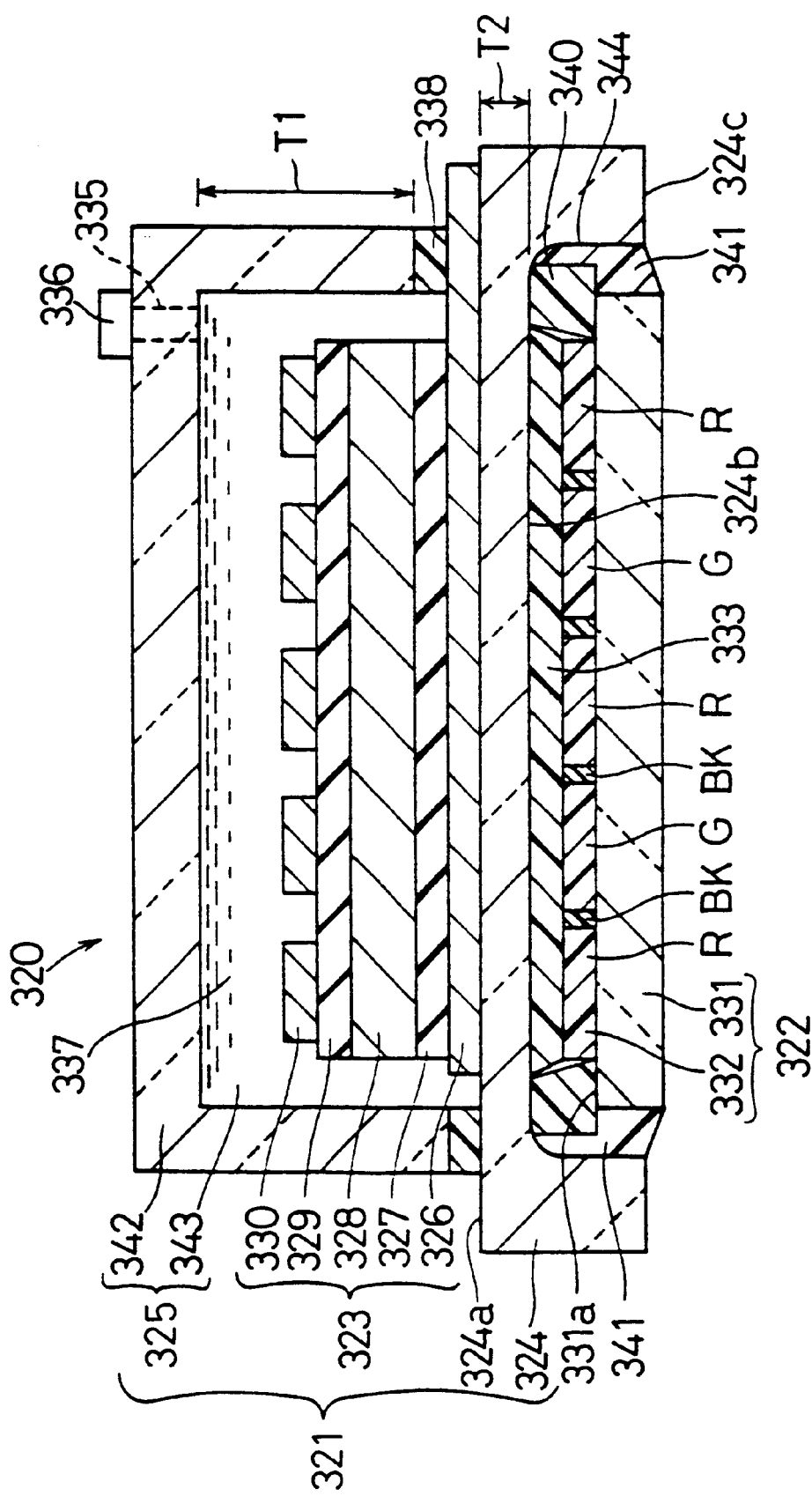
FIG. 15 is a cross-sectional view showing a color EL display apparatus 320 manufactured by a light-transmitting substrate bonding method according to a seventh embodiment of the invention.

FIG. 15 is a cross-sectional view showing a color EL display apparatus 320 manufactured by a light-transmitting substrate bonding method according to a seventh embodiment of the invention.

The color EL display apparatus 320 comprises an EL device 321 and a color filter substrate 322 bonded together. The EL device 321 comprises a light-transmitting EL-device substrate 324, an EL device portion 323 and a sealing portion 325. The color filter substrate 322 comprises a light-transmitting substrate 331 and a color filter 332.

The EL device 321 is a double-insulation-type thin-film EL device in which a first electrode 326, a first insulation film 327, a light emission layer 328, a second insulation film 329 and a second electrode 330 constituting the EL device portion 323 are successively laminated on the EL-device substrate 324 made of glass. To form the first electrode 326, ITO (indium-tin oxide) is deposited on one surface 324a of the EL-device substrate 324 in a thickness of approximately 200 nm by the electron beam vapor deposition method or the high-frequency sputtering method, and the first electrode 26 is formed in stripes by wet etching using a photoresist.

The first insulation film 327 laminated on the first electrode 326 comprises a lamination of an $SiO_2$ film with a thickness of approximately 40 nm and an $Si_3N_4$ film with a thickness of approximately 220 nm, and is formed by the high-frequency sputtering method. As the light emission layer 328, a ZnS:Mn layer is formed in a thickness of approximately 7000 Å by the electron beam vapor deposition method using a ZnS:Mn pellet as the evaporation source. The EL light emission layer 328 emits yellow light including red to green light emission ranges by applying an alternating field between the first and the second electrodes 326 and 330, and by dividing the light into spectra by red and green color filters, a multicolor EL display apparatus of red and green can be produced.

The reason why the light emission layer 328 is used in this embodiment is that a monochrome EL display apparatus using this light emission layer has already been put to practical use and it has been confirmed that the material of the light emission layer is excellent in light emission brightness and light emission stability. The color EL display apparatus embodying the invention is not limited to such a multicolor EL display apparatus of red and green, but a full-color EL display apparatus can be produced, for example, by driving into spectra white EL light emitted from a lamination of ZnS:Mn and SrS:Ce light emission layers by color filters of red, green and blue.

The second insulation film 329 laminated on the light emission layer 328 comprises a lamination of an $Si_3N_4$ film with a thickness of approximately 100 nm and an $SiO_2$ film with a thickness of approximately 35 nm. These films are formed by the high-frequency sputtering method. After the formation of the second insulation film 329, high vacuum annealing is performed in order to improve the crystallinity of the light emission layer 328. The high vacuum annealing is performed at 630° C. in a high vacuum of not more than $1 \times 10^{-14}$ Pa.

Lastly, as the second electrode 330, Al is deposited in a thickness of approximately 500 nm by heat vapor deposition, and the second electrode 330 is formed in stripes perpendicular to the first electrode by wet etching using a photoresist, so that the EL device portion 323 is completed.

To form the moistureproof sealing portion 325 of the EL device 321, a protective glass 342 where digging processing is performed to a depth T1 of approximately 1 mm is disposed so that the EL device portion 323 is sealed in the portion where the digging processing is performed, and the periphery of the protective glass 342 is bonded onto the one surface 324a of the EL-device substrate 324 by use of an epoxy resin 338. Then, silicone oil mixed with silica gel is filled into a sealed space 337 where the EL device portion 323 is sealed through an oil introduction hole 335 formed in the protective glass 342 in advance, and the introduction hole is closed by a sealing glass 336. In the case where silicone oil is filled, under condition where the sealed space 337 is evacuated by exhausting air in the sealed space 337 through the oil introduction hole 335, silicone oil is absorbed through the oil introduction hole 335 so that the sealed space 337 is filled with silicone oil. Thus, since it is necessary that the sealed space 337 be evacuated when oil is filled, the EL-device substrate 324 has a thickness that endures such a vacuum when oil is filled.

After the EL device portion 323 and the moistureproof sealing portion 325 are formed on the EL-device substrate 324, by etching using hydrofluoric acid, a concave portion 344 is formed in the EL-device substrate 324 so that the thickness T2 of the portion of the EL-device substrate 324 opposed to the EL device portion 323 is approximately 100 µm. At this time, in view of the mounting of the color EL display apparatus 320, only the portion where the color filter substrate 322 is fitted is etched into a concave so that the periphery of the EL-device substrate 324 is left in a frame shape. Since the EL-device substrate 324 interposed between the EL device portion 323 and the color filter 332 is thinned by etching, the distance between the first electrode 326 of the EL device portion 323 and the color filter 332 decreases. Consequently, the viewing angle deterioration due to color displacements can be prevented, so that a large viewing angle can be ensured.

The methods of mounting the color filter 332 include the following: a method in which the color filter 332 is directly formed on the other surface 324b which is the bottom surface of the concave portion 344 of the EL-device substrate 324, and the substrate 331 is bonded thereonto; and a method in which the substrate 331 where the color filter 332 is formed is bonded to the other surface 324b of the EL-device substrate 324. According to the latter method, since an adhesive layer is interposed between the color filter 332 and the EL-device substrate 324, the thickness of the adhesive layer affects the viewing angle. According to the former method, it is necessary to directly form the color filter 332 on the other surface 324b of the EL-device substrate 324 which is the bottom surface of the concave portion 344, and the production of the color filter 332 is difficult. Therefore, this embodiment employs the latter method where the production of the color filter 332 is easier.

The color filter 332 of the color filter substrate 322 comprises red and green filters R and G alternately arranged on a light-transmitting glass substrate 331a. Black filters Bk are formed between the filters R and G. The color filter substrate 322 and the EL-device substrate 324 of the EL device 321 are bonded together by filling a thermosetting synthetic resin 333 into the gap between the color filter 332 side surface of the color filter substrate 322, that is, the surfaces of the filters R, G and BK opposed to the other surface 324b of the EL-device substrate 324 and the one surface 331a of the substrate 331, and the other surface 324b of the EL-device substrate 324. The one surface 331a of the substrate 331 where the color filter 332 is not disposed and the EL-device substrate 324 are fixed at not less than two points (at the left and right ends of the substrate 331 in FIG. 15) by a photo-setting resin 340. The gap between the color filter substrate 322 and the EL-device substrate 324, that is, the periphery of the color filter substrate 322 is filled with a silicone resin 341. Thus, the color filter substrate 322 and the EL device 321 are bonded together with a great strength.

Figure 16:
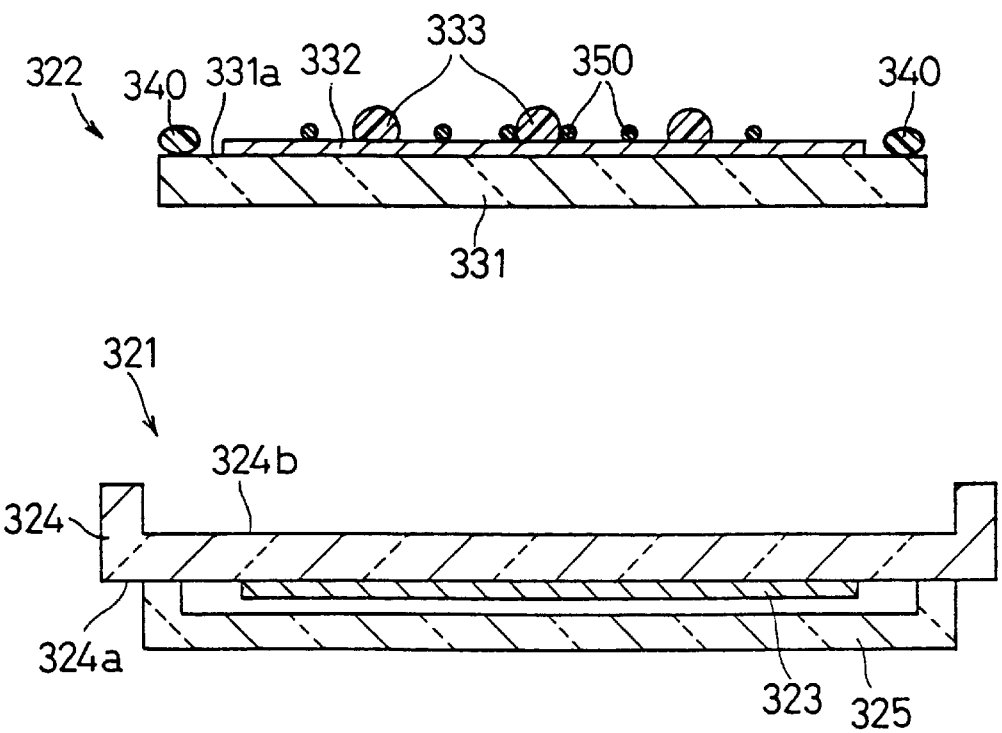
FIG. 16 is a cross-sectional view showing an EL-device substrate 324, and a color filter substrate 322 where a liquid hardening resin 333 is dropped.

Subsequently, the general outline of the method of bonding the color filter substrate 322 and the EL-device substrate 321 will be shown. First, as shown in FIG. 16, the color filter substrate 322 and the EL device 321 are prepared, and onto the surface of the color filter 332 of the color filter substrate 322, spacers 350 comprising, for example, adhesive beads are fixed. Then, a plurality of drops of a liquid thermosetting resin 333 is applied so as to convexly bulge in a conical shape having one convex portion as shown in FIG. 16. The resin 333 has no bubbles mixed therein, and has a viscosity of a degree such that the resin does not thinly spread when dropped and that the resin does not drop when the color filter substrate 322 is overturned when the substrates are brought into intimate contact as described later. On the color filter substrate 322, the photo-setting resin 340 is placed on at least two points of the portion of the one surface 331a of the substrate 331 where the color filter 332 is not disposed.

To fix the spacers 350, adhesive beads (adhesive spacers CBS-20725, CB-210, manufactured by Sekisui Fine Chemical) with a grain diameter of 7.25 $\mu$m or 10 $\mu$m are sprayed onto the color filter 332, and then, the color filter 332 is heated in an oven at 150° C. for 20 minutes to fix the spacers 350. At this time, the beads spraying density is 15 per 1 mm$^2$.

As the resin 333, a thermosetting resin (a thermosetting resin prototype manufactured by Mitsui Chemicals Inc.) was used. Since the resin has a viscosity of 2000 cps at an ordinary temperature, it is easy to drop the resin so as to convexly bulge, and the resin can be prevented from easily dropping when the color filter substrate 322 is overturned. Further, since the viscosity of the resin is decreased to approximately 100 cps at the time of heating, the resin is smoothly spread in the gap between the substrates.

Figure 17:
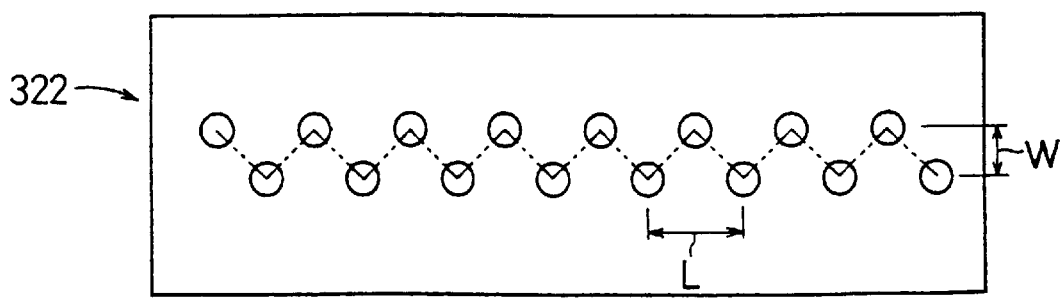
FIG. 17 is a plan view of the color filter substrate 322 showing the positions where the resin 333 is dropped.

Since the color filter substrate 322 has a rectangular form with dimensions of 25 cm×8 cm (the area is 200 cm$^2$) as shown in FIG. 17, the resin 333 is dropped onto 16 points along a zigzag line in the direction of length of the color filter substrate 322 as shown in the figure. At this time, the distance L between dropped points adjoining in the direction of the length is 3 cm, and the width W of the zigzag is 1.5 cm. The dropping amount per point is 0.015 to 0.03 cc. With the dropping amount of this degree, the resin 333 is surely prevented from dropping when the color filter substrate 322 is overturned.

Figure 18:
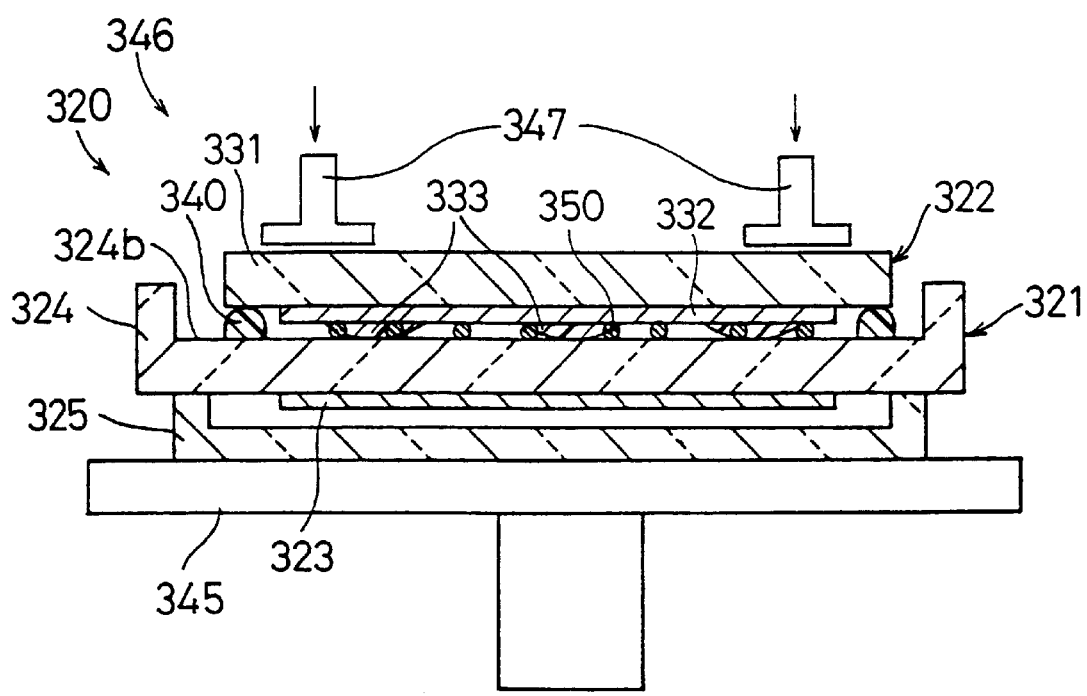
FIG. 18 is a cross-sectional view showing a condition in which the color filter substrate 322 and the EL device 323 are bonded together.

Then, the EL device 321 and the color filter substrate 322 are brought into intimate contact by an intimate contact jig 346 shown in FIG. 18. The intimate contact jig 346 has an EL substrate support 345 and a pressing portion 347. First, the EL-device substrate 324 is placed on the EL substrate support 345 with the other surface 324b facing upward, and then, the color filter 322 is overturned so that the color filter 332 of the color filter substrate 322 is opposed to the other surface 324b of the EL-device substrate 324. By thus overturning the color filter substrate 322, the dropped resin 333 further bulges convexly by its own weight, so that the resin 333 can be filled in the gap between the substrates 324 and 331 without any bubbles being formed.

When the color filter substrate 322 is placed on the EL-device substrate 324 to bond the substrates 322 and 324 together, the color filter substrate 322 is positioned by aligning the electrode pattern of the first electrode 326 of the EL device 323 of the EL-device substrate 324 and the pattern of the color filter 332 of the color filter substrate 331, and the photo-setting resin 340 is hardened by applying ultraviolet rays to the portion where the photo-setting resin 340 is placed under a condition where the portion of the photo-setting resin 340 is pressed by the pressing member 347, thereby temporarily fixing the color filter substrate 322 and the EL device 321. Since the photo-setting resin 340 is placed on the portion where the color filter 332 is not formed as mentioned previously, it never occurs that the ultraviolet rays are absorbed by the color filter 332; the photo-setting resin 340 can surely be hardened to temporarily fix the color filter substrate 322 and the EL device 321.

Then, the pressing member 347 is separated, and the color filter 322 and the EL-device substrate 321 being temporarily fixed are placed in an oven as they are to harden the thermosetting resin 333. The oven in which the EL-device substrate 324 and the color filter substrate 322 being temporarily fixed are placed is heated first at 80° C. for 20 minutes. The resin 333 used in this embodiment does not harden at 80° C. and is decreased in viscosity to approximately 100 cps.

When the EL-device substrate 321 and the color filter substrate 322 are bonded together, since the temperature is an ordinary temperature, the resin 333 is high in viscosity and convexly bulges. Moreover, since the EL-device substrate 324 is etched so that its thickness T2 is approximately 100 $\mu$m in order to prevent the viewing angle from deteriorating, at the point of time when the color filter substrate 322 and the EL-device substrate 324 are bonded together for temporarily fixing, the EL-device substrate 324 is concaved and distorted at the portion where the resin 333 is dropped. Moreover, the spacers 350 are interposed between the color filter substrate 332 and the EL-device substrate 324, so that the distance between the color filter substrate 331 and the EL-device substrate 324 is prevented from being smaller than a predetermined value.

Figure 19A:
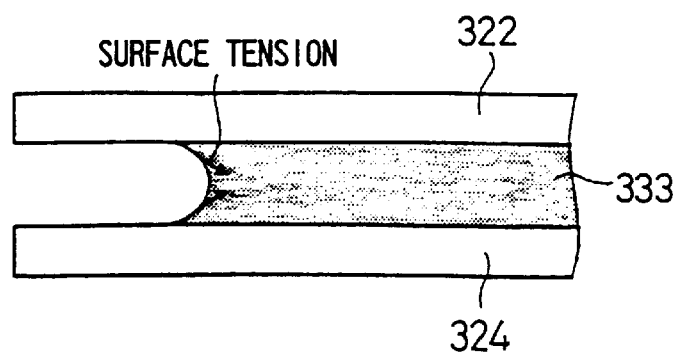
FIGS. 19A and 19B are views schematically showing the condition in which a surface tension acts in a gap between the substrates being in intimate contact, and a manner in which the inserted resin 333 spreads due to a capillary phenomenon.
Figure 19B:
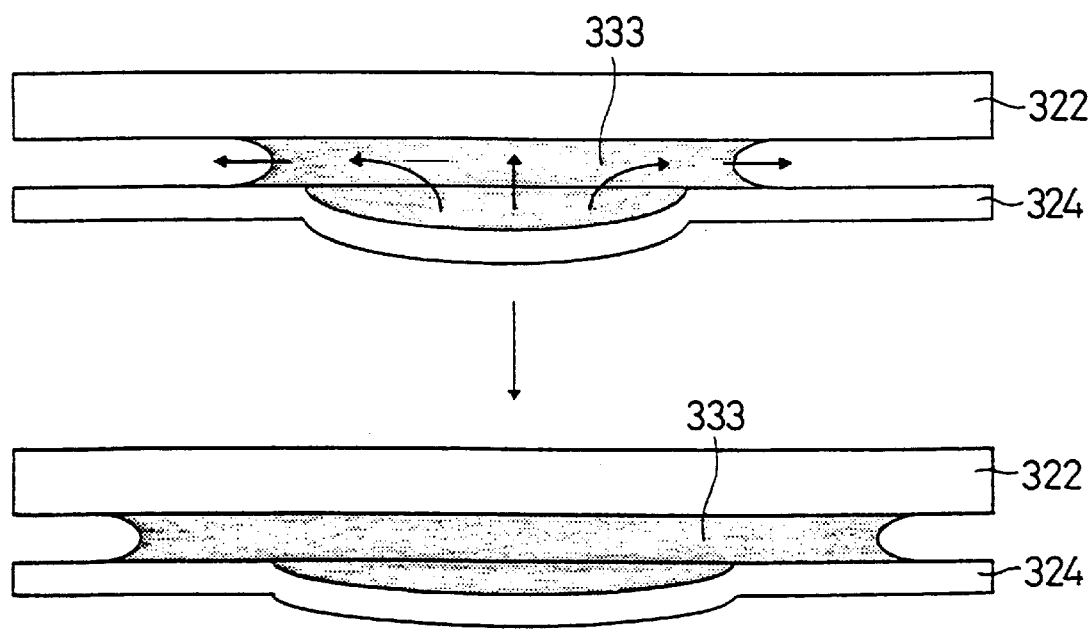

When the substrates 322 and 321 are heated to 80° C. in the oven under this condition, the resin 333 is decreased in viscosity to approximately 100 cps. Then, as shown in FIG. 19A, a capillary phenomenon is caused in the gap between the color filter substrate 322 and the EL-device substrate 324 by the surface tension at the surface of the resin 333 having been decreased in viscosity, so that the resin 333 having been decreased in viscosity is spread in the gap between the substrates 322 and 324. Since the surface tension causes a force to act in a direction that brings the color filter substrate 322 and the EL-device substrate 324 into intimate contact, the resin 333 is spread in the gap between the substrates 322 and 324 without any external force being exerted on the substrates 322 and 324. Moreover, although the EL-device substrate 324 is concaved and distorted at the resin dropped portion when the substrates are bonded together, by the spread of the resin 333 to the periphery due to the capillary phenomenon and the force that acts in the direction that brings the substrates 322 and 324 into intimate contact with each other, the resin 333 in the concaved portion at the resin dropped portion is successively discharged to the periphery as shown in FIG. 19B. The concave at the resin dropped portion is thus eliminated, so that the EL-device substrate 324 becomes flat. As a result, the display screen is prevented from being distorted.

The resin 333 cannot be filled into the gap between the color filter substrate 332 and the EL-device substrate 324 when the substrates 322 and 324 are in absolute contact with each other. However, in this embodiment, the substrates 322 and 324 are prevented from being brought into absolute contact by interposing the spacers 350 therebetween, so that the resin 333 having been decreased in viscosity can smoothly be spread in the gap between the substrates 322 and 324.

When local concave portions are formed in the surfaces of the opposed substrates 322 and 324, there are cases where bubbles are formed due to the difference in speed of spread of the resin 333 between at the local concave portions P and at the periphery thereof as described with reference to FIG. 21. This occurs when the distance between the substrates 322 and 324 largely differs between at the concave portions P and at the periphery thereof. Therefore, the formation of bubbles can be prevented by decreasing the difference between the distance between the substrates 322 and 324 at the local concave portions P and the distance between the substrates 322 and 324 at the periphery. That is, by increasing the grain diameter of the spacers 350 interposed between the substrates 322 and 324, the difference between the distance at the concave portions P and the distance at the periphery can be reduced to suppress the formation of bubbles.

In this embodiment, two kinds of spacers were prepared by using the spacers 350 comprising two kinds of beads with grain diameters of 7.25 $\mu$m and 10 $\mu$m, and using these two kinds of spacers 350, bonding was performed with the amount of resin filled into the gap between the substrates 322 and 324 being 0.32 cc (0.02 cc per drop, 16 drops were applied). Although bubbles were formed when the beads with a grain diameter of 7.25 $\mu$m were used, no bubbles were formed when the beads with a diameter of 10 $\mu$m were used. From this, it was found that the use of beads with a grain diameter of not less than 10 $\mu$m is effective in preventing the formation of bubbles. When the grain diameter of the spacers is not less than 100 $\mu$m, the distance between the color filter substrate 322 and the EL-device substrate 324 is increased, so that it is difficult to spread the resin 333 by use of the capillary phenomenon and the distance between the EL device portion 323 and the color filter 332 is increased to deteriorate the viewing angle.

The resin 333 inserted between the substrates 322 and 324 spreads due to the capillary phenomenon, and a force acts on the substrates 322 and 324 in the direction that brings the substrates 322 and 324 into intimate contact with each other in the process of spread of the resin, so that the distortion caused when the substrates 322 and 324 are bonded together is eliminated. However, when the spread resin reaches to the periphery of the color filter substrate 322, the spread of the resin 333 due to the capillary phenomenon stops, so that the distortion of the EL-device substrate 324 is not eliminated. Consequently, the display quality deteriorates. This problem occurs when the amount of the resin inserted between the substrates 322 and 324 is too large. When the amount of the inserted resin is too small, it is impossible to spread the resin so as to fill the entire gap between the substrates 322 and 324. The display quality also deteriorates in this case.

In the above-described manufacturing method, using the spacers 350 comprising beads with a grain diameter of 10 $\mu$m, bonding was performed with the amount of the resin inserted between the substrates 322 and 324 being 0.28 cc, 0.32 cc, 0.40 cc and 0.44 cc (16 drops were applied in all cases). When the amount of the resin was 0.44 cc, a somewhat conspicuous distortion was found. From this, it is desirable that the amount of the resin inserted between the substrates 322 and 324 be less than 0.44 cc. Therefore, when the area of the region between the substrates 322 and 324 to be filled with the resin is S (in this embodiment, S is the area of one surface of the color filter substrate 322 opposed to the other surface 324b of the EL-device substrate 324) and the grain diameter of the spacers is d, it was found that it is desirable that the amount D of the resin inserted between the substrates (in this embodiment, D is the total amount of the resin dropped onto the color filter substrate 322) satisfy the following condition:

$$D<S\cdot(d+12\ \mu m).$$

In this embodiment, S=200 cm$^2$, d=10 $\mu$m, and D=0.44 cc.

Since the lower limit of the resin amount D when the substrate-to-substrate distance is d and the resin is spread over the area S is S·d, it is desirable that the amount D of the inserted resin satisfy the following condition:

$$S\cdot d<D<S\cdot(d+12\ \mu m).$$

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of manufacturing a color EL display apparatus, comprising:

preparing EL devices in which a first light-transmitting electrode, an EL light emission layer, and a second electrode are formed on one surface of a first light-transmitting EL-device substrate wherein EL light is emitted from the other surface of the EL-device substrate, and a color filter substrate wherein color filters are disposed on one surface of a second light-transmitting substrate, and providing a thermosetting resin in a gap between the other surface of the EL-device substrate and the surface of the color filter substrate where the color filters are disposed so as to completely fill the gap with the thermosetting resin, and then thermally setting the thermosetting resin to bond the color filter substrate and the EL-device substrate to one another.

2. The method of claim 1, further comprising locating the thermosetting resin in a manner such that the thermosetting resin after being set is in contact with said color filters on said color filter substrate.

3. The method of manufacturing a color EL display apparatus of claim 1, wherein when the EL-device substrate and the color filter substrate are bonded together, a liquid thermosetting resin is dropped on one substrate so as to convexly bulge, the two substrates are brought into intimate contact so that the thermosetting resin is spread to fill the gap between the substrates, the substrates are fixed by a photo-setting resin at a portion where color filters are not disposed under a condition where the EL-device substrate and the color filter substrate are positioned, and then, the substrates are heated to harden the thermosetting resin, thereby bonding the two substrates.

4. The method of manufacturing a color EL display apparatus of claim 3, wherein the liquid thermosetting resin is lower in viscosity when heated than at an ordinary temperature, and when the substrates are heated, a force is exerted on the substrates so that the resin between the substrates is spread.

5. The method of manufacturing a color EL display apparatus of claim 1, wherein when the EL-device substrate and the color filter substrate are bonded together, a thermosetting resin is dropped so as to convexly bulge on one substrate at a plurality of points along a straight line or a zigzag line, the two substrates are brought into intimate contact to spread the thermosetting resin so as to fill a gap between the substrates, the substrates are fixed by a photo-setting resin at a portion where the color filters are not disposed under a condition where the EL-device substrate and the color filter substrate are positioned, and then, the substrates are heated to harden the thermosetting resin, thereby bonding the substrates.

6. A method of manufacturing a color EL-display, the method comprising:

preparing an EL device portion including a first light transmitting electrode, an EL light emission layer, and a second electrode formed on one side of an EL device substrate which is light transmitting, wherein EL light is emitted from the other side of said EL device substrate;

providing color filters located on one side of another substrate; and providing a thermosetting resin in contact with at least one of said color filters and in a gap between said other side of said EL device substrate and said color filters, and thermally setting the thermosetting resin in order to bond said another substrate with said color filters thereon and said EL device substrate to one another.

* * * * *